(12) United States Patent
Hardin et al.

(10) Patent No.: US 8,237,061 B2
(45) Date of Patent: Aug. 7, 2012

(54) Z-DIRECTED FILTER COMPONENTS FOR PRINTED CIRCUIT BOARDS

(75) Inventors: Keith Bryan Hardin, Lexington, KY (US); Paul Kevin Hall, Lexington, KY (US); Robert Aaron Oglesbee, West Lafayette, IN (US)

(73) Assignee: Lexmark International, Inc., Lexington, KY (US)

( * ) Notice: Subject to any disclaimer, the term of this patent is extended or adjusted under 35 U.S.C. 154(b) by 552 days.

(21) Appl. No.: 12/508,199

(22) Filed: Jul. 23, 2009

(65) Prior Publication Data

US 2011/0019376 A1 Jan. 27, 2011

(51) Int. Cl.
*H05K 1/16* (2006.01)

(52) U.S. Cl. .......... 174/260; 174/262; 361/761
(58) Field of Classification Search .......... 174/260, 174/262–266; 361/761–764, 783
See application file for complete search history.

(56) References Cited

U.S. PATENT DOCUMENTS

| | | |
|---|---|---|
| 2,005,582 A | 3/1934 | Given |
| 3,219,886 A | 11/1965 | Katzin et al. |
| 3,377,611 A | 4/1968 | Pawl el al. |
| 3,652,971 A | 3/1972 | Bugg |
| 3,691,326 A | 9/1972 | Grossman et al. |
| 3,798,394 A | 3/1974 | Stokes |
| 3,996,440 A | 12/1976 | Niconienko |
| 4,109,295 A | 8/1978 | Rostek et al. |
| 4,109,296 A | 8/1978 | Rostek et al. |
| 4,381,134 A | 4/1983 | Anselmo et al. |
| 4,675,625 A | 6/1987 | Johnston |
| 4,700,155 A | 10/1987 | Sakamoto et al. |
| 4,850,892 A | 7/1989 | Clayton et al. |
| 5,147,985 A | 9/1992 | DuBrucq |
| 5,344,343 A | 9/1994 | Seidler |
| 5,603,847 A | 2/1997 | Howard et al. |
| 5,708,569 A | 1/1998 | Howard et al. |
| 5,952,723 A | 9/1999 | Takeyasu et al. |
| 6,153,290 A | 11/2000 | Sunahara |
| 6,388,208 B1 | 5/2002 | Kiani et al. |
| 6,593,535 B2 | 7/2003 | Gailus |
| 6,735,855 B2 | 5/2004 | Akram et al. |
| 6,983,535 B2 | 1/2006 | Crockett et al. |
| 7,238,892 B2 | 7/2007 | Bois et al. |
| 7,416,985 B2 | 8/2008 | Yamamoto et al. |
| 7,486,498 B2 | 2/2009 | Welsch et al. |
| 7,820,479 B2 | 10/2010 | Sakaguchi |
| 7,888,599 B2 | 2/2011 | Kim et al. |
| 2001/0012036 A1 | 8/2001 | Giere et al. |
| 2003/0101585 A1 | 6/2003 | Pearson et al. |
| 2004/0121266 A1 | 6/2004 | Lee et al. |

(Continued)

OTHER PUBLICATIONS

Prosecution history of copending U.S. Appl. No. 12/508,131 including non-final Office Action dated Sep. 30, 2011.

(Continued)

*Primary Examiner* — Jeremy Norris
(74) *Attorney, Agent, or Firm* — John Victor Pezdek; Justin M Tromp

(57) ABSTRACT

A Z-directed filter component for insertion into a printed circuit board while allowing electrical connection to internal conductive planes contained with the PCB. In one embodiment the Z-directed filter component is mounted within the thickness of the PCB allowing other components to be mounted over it. The filter may be T-filter or a Pi-filter within the body of the Z-directed component. The body may also contain one or more conductors and may include one or more surface channels or wells extending along at least a portion of the length of the body. Methods for mounting Z-directed components are also provided.

8 Claims, 13 Drawing Sheets

U.S. PATENT DOCUMENTS

| | | |
|---|---|---|
| 2006/0054352 A1 | 3/2006 | Ryu et al. |
| 2006/0145800 A1 | 7/2006 | Dadafshar et al. |
| 2006/0243581 A1 | 11/2006 | Nishimoto et al. |
| 2006/0286696 A1 | 12/2006 | Peiffer et al. |
| 2007/0051594 A1 | 3/2007 | Schwarz et al. |
| 2007/0085125 A1 | 4/2007 | Inoue et al. |
| 2007/0124930 A1 | 6/2007 | Cheng et al. |
| 2007/0138646 A1 | 6/2007 | Heston et al. |
| 2008/0047137 A1 | 2/2008 | Asahi et al. |
| 2008/0158851 A1 | 7/2008 | Cochrane |
| 2008/0169125 A1 | 7/2008 | Hsu et al. |
| 2008/0202799 A1 | 8/2008 | Graydon et al. |
| 2008/0223603 A1 | 9/2008 | Kim et al. |
| 2009/0046441 A1 | 2/2009 | Funaya et al. |
| 2009/0097218 A1 | 4/2009 | Miyamoto |
| 2009/0114421 A1 | 5/2009 | Swift et al. |
| 2009/0175012 A1 | 7/2009 | Frasco |
| 2009/0219667 A1 | 9/2009 | Eriksson |
| 2010/0124035 A1 | 5/2010 | Bandholz et al. |
| 2010/0208440 A1 | 8/2010 | Peiffer et al. |
| 2010/0230806 A1 | 9/2010 | Huang et al. |
| 2010/0237495 A1 | 9/2010 | Pagaila et al. |
| 2011/0017502 A1 | 1/2011 | Hardin et al. |
| 2011/0017503 A1 | 1/2011 | Hardin et al. |
| 2011/0017504 A1 | 1/2011 | Hardin et al. |
| 2011/0017505 A1 | 1/2011 | Hardin et al. |
| 2011/0017507 A1 | 1/2011 | Hardin et al. |
| 2011/0017581 A1 | 1/2011 | Hardin et al. |
| 2011/0019374 A1 | 1/2011 | Hardin et al. |
| 2011/0019375 A1 | 1/2011 | Hardin et al. |
| 2011/0019376 A1 | 1/2011 | Hardin et al. |

OTHER PUBLICATIONS

Prosecution history of copending U.S. Appl. No. 12/508,158 including non-final Office Action dated Oct. 19, 2011.
Prosecution history of copending U.S. Appl. No. 12/508,204 including non-final Office Action dated Oct. 7, 2011.
Prosecution history of copending U.S. Appl. No. 12/508,248 including non-final Office Action dated Sep. 30, 2011.
2010 Spectrum Advanced Specialty Products Catalog; relevant pp. AC2-AC12; Spectrum Advanced Specialty Products; Fairview, PA USA.
International Searching Authority, International Search Report and Written Opinion for PCT US2011_022005, Mar. 18, 2011.
International Searching Authority, International Search Report and Written Opinion for PCT US2011_022008, Mar. 29, 2011.
International Searching Authority, International Search Report and Written Opinion for PCT US2011_022012, Apr. 11, 2011.
International Searching Authority, International Search Report and Written Opinion for PCT US2011_022019, Mar. 23, 2011.
International Searching Authority, International Search Report and Written Opinion for PCT US2011_022021, Mar. 28, 2011.
International Searching Authority, International Search Report and Written Opinion for PCT US2011_022022, Mar. 28, 2011.
International Searching Authority, International Search Report and Written Opinion for PCT US2011_022027, May 2, 2011.
International Searching Authority, International Search Report and Written Opinion for PCT US2011_022028, Apr. 1, 2011.
International Searching Authority, International Search Report and Written Opinion for PCT US2011_022036, Apr. 1, 2011.
"IPC Standards—The Evolution of Embedded Components Standards"; IPC Review Mar./Apr. 2009; p. 14; vol. 2, No. 2; IPC, Inc., Bannockburn, IL USA.
Prosecution history of copending U.S. Appl. No. 12/508,145 including Ex Parte Quayle Action dated Feb. 2, 2012.

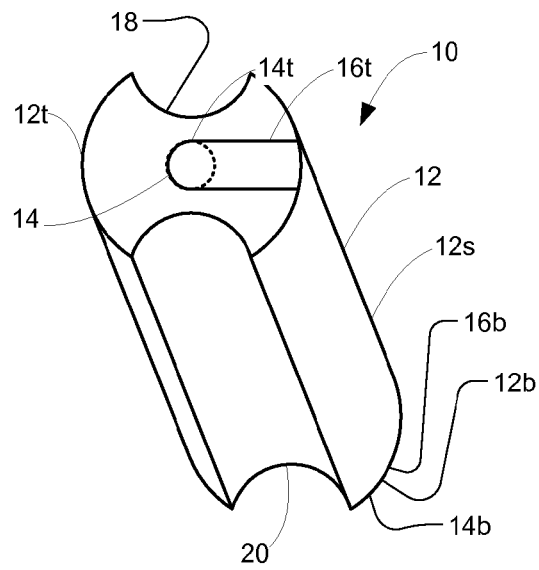
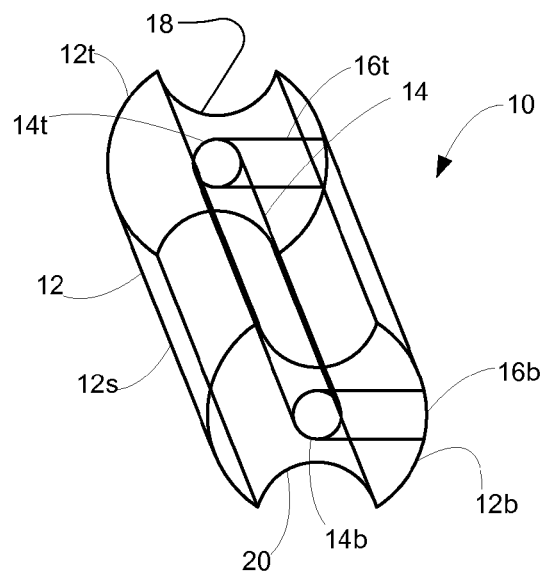
Figure 1
Figure 2
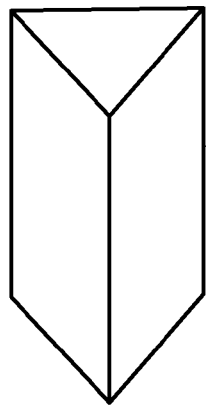
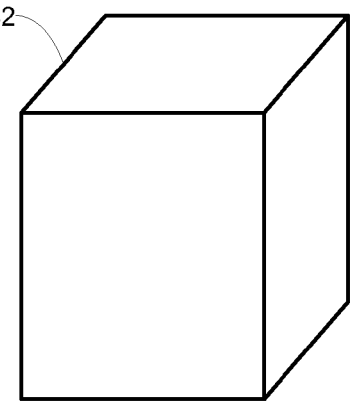
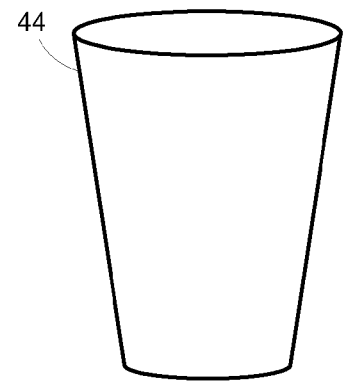
Figure 3A
Figure 3B
Figure 3C
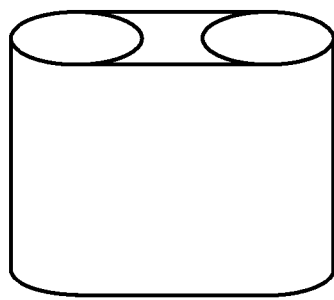
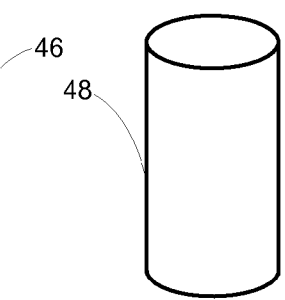
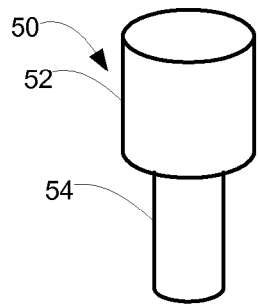
Figure 3D
Figure 3E
Figure 3F

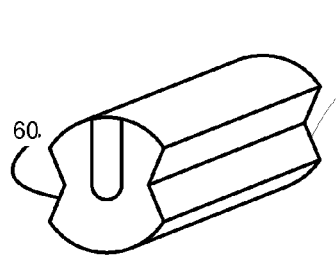
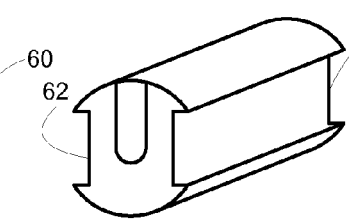
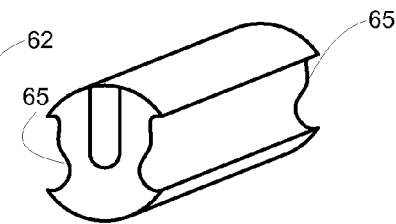
Figure 4A       Figure 4B       Figure 4C
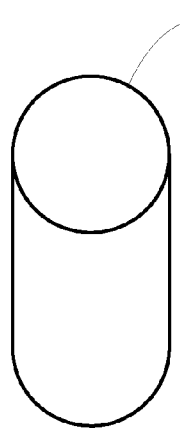
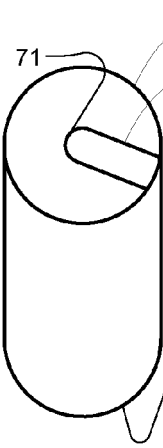
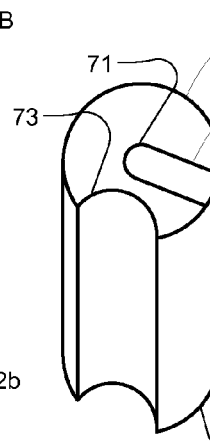
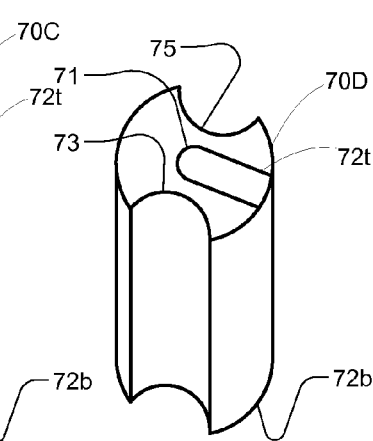
Figure 5A       Figure 5B       Figure 5C       Figure 5D
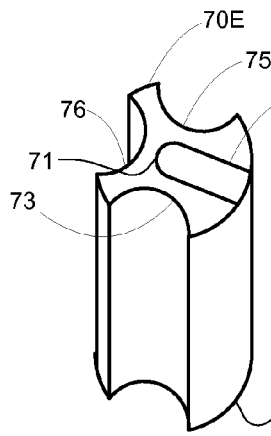
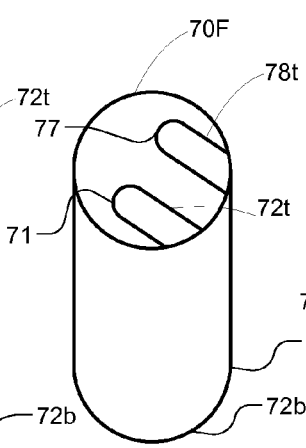
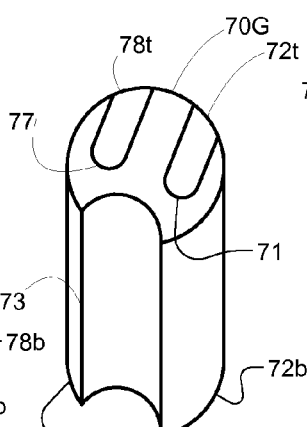
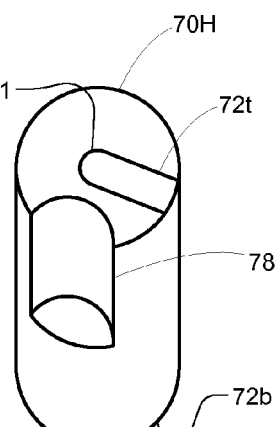
Figure 5E       Figure 5F       Figure 5G       Figure 5H

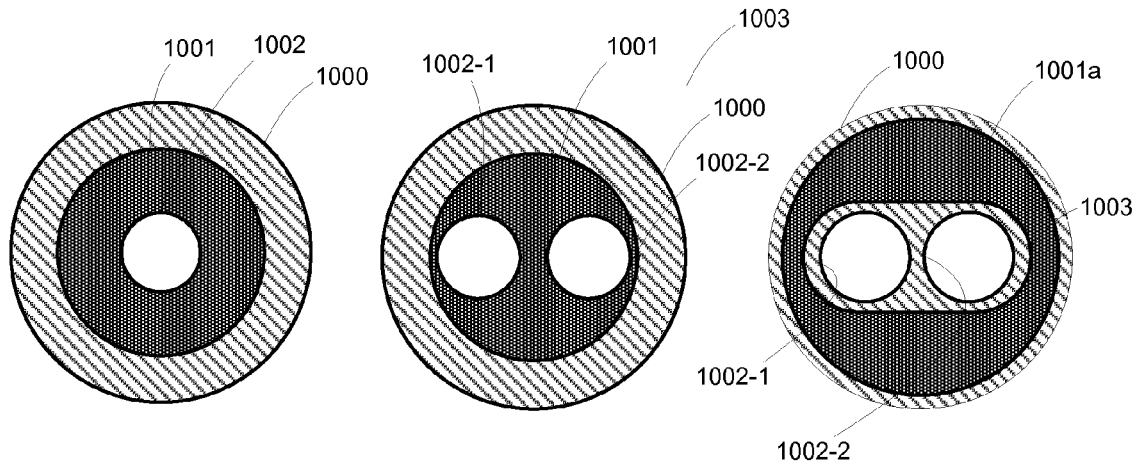
Figure 19A  Figure 19B (Differential mode)  Figure 19C (Common Mode)
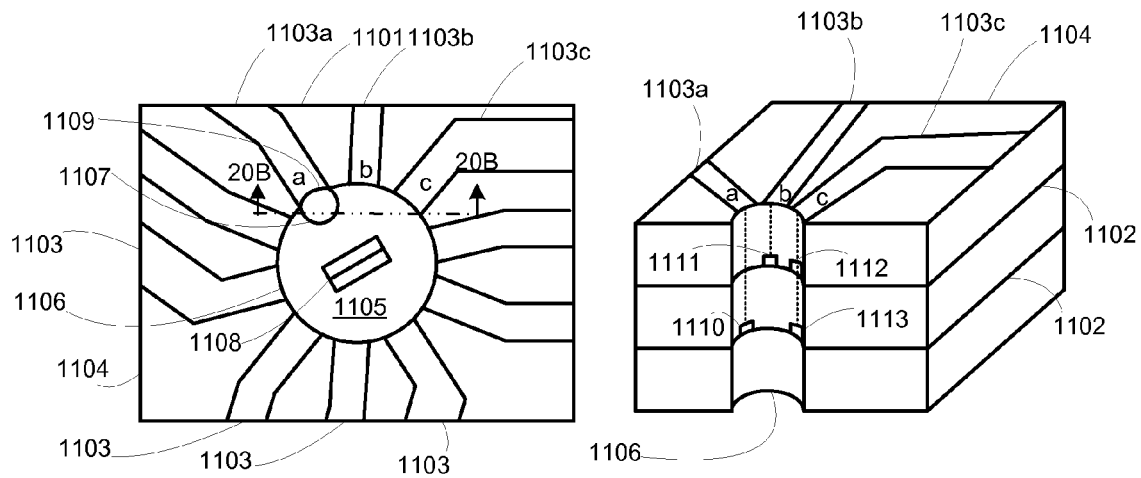
Figure 20A  Figure 20B
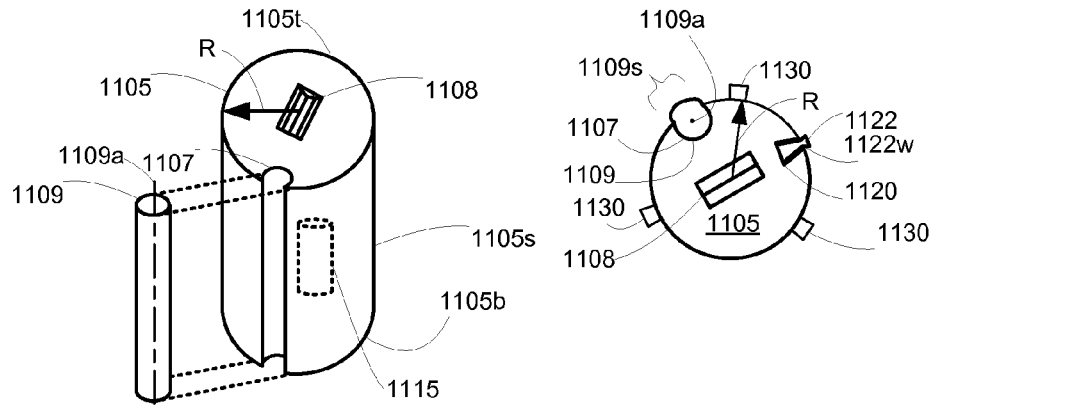
Figure 20C  Figure 20D

Z-DIRECTED FILTER COMPONENTS FOR PRINTED CIRCUIT BOARDS

CROSS REFERENCES TO RELATED APPLICATIONS

This patent application is related to U.S. patent application Ser. No. 12/508,131 entitled "Z-directed Components for Printed Circuits Boards"; Ser. No. 12/508,145 entitled "Z-directed Pass-Through Components for Printed Circuits Boards"; Ser. No. 12/508,158 entitled "Z-directed Capacitor Components for Printed Circuits Boards"; Ser. No. 12/508,188 entitled "Z-directed Delay Line Components for Printed Circuits Boards"; Ser. No. 12/508,204 entitled "Z-directed Ferrite Bead Components for Printed Circuits Boards"; Ser. No. 12/508,215 entitled "Z-directed Switch Components for Printed Circuits Boards"; Ser. No. 12/508,236 entitled "Z-directed Connector Components for Printed Circuits Boards"; Ser. No. 12/508,248 entitled "Z-directed Variable Value Components for Printed Circuits Boards"; each filed Jul. 23, 2009 and all assigned to the assignee of the present application.

STATEMENT REGARDING FEDERALLY SPONSORED RESEARCH OR DEVELOPMENT

None.

REFERENCE TO SEQUENTIAL LISTING, ETC.

None.

BACKGROUND

1. Field of the Invention

The present invention relates to electronic components, and more particularly to those for insertion into a printed circuit board and methods of assembly.

2. Description of the Related Art

Printed Circuit Board (PCB) manufacturing primarily uses two types of components. The first type is pin through-hole parts that use metallic leads that are soldered into a plated through-hole in the PCB. The second type of component is a surface mount part that sits on the surface of a PCB and is attached by soldering to pads on the surface. As densities of components have increased and higher frequencies of operation are used, some circuit's designs have become very difficult to achieve. The presented invention improves the component densities and frequencies of operation.

Currently resistors can be embedded between layers of a PCB by applying a resistive material between two copper traces after the etching step in the manufacturing process. A typical 4 layer PCB is made up of two assemblies that are each two layer PCBs. These are glued together with a material to become the completed assembly. The resistive area can be applied to any layer making it possible to have the resistive elements on the interior layers. However this approach is more time consuming and makes changes difficult to implement. The present invention removes these difficulties by allowing for insertion of the part to occur after the multilayered PCB is assembled.

SUMMARY OF THE INVENTION

A Z-directed multi-terminal component for mounting in a printed circuit board (PCB) having a mounting hole having a depth D therein, comprises an insulative body having a top surface, a bottom surface and side surface, a cross-sectional shape that is insertable into the mounting hole in the PCB and a length L, at least one conductor extending through at least a portion of the length L of the body with the conductor in electrical connection with one of the top and bottom surfaces of the body, one of the top and bottom surfaces further comprising a conductive trace electrically connected an end of the conductor adjacent thereto and extending therefrom to an edge of the body, the side surface of the body further comprising at least two channels therein, each of the at least two channels extending from at least one of the top surface and bottom surface toward the opposite surface; and a three-terminal filter disposed within the body interconnecting the conductor, and each of the at least two channels.

In another form a Z-directed multi-terminal component for mounting in a printed circuit board (PCB) having a mounting hole having a depth D therein, comprises an insulative body having a top surface, a bottom surface and side surface, a cross-sectional shape that is insertable into the mounting hole in the PCB and a length L, at least two conductors extending through at least a portion of the length L of the body with one of the at least two conductor in electrical connection with one of the top and bottom surfaces of the body and the other of the at least two conductors in connection with the other one of the top and bottom surfaces of the body, each of the top and bottom surfaces further comprising a conductive trace electrically connected an end of the conductor adjacent thereto and extending therefrom to an edge of the body, the side surface further comprising at least one channel therein, the at least one channel extending from at least one of the top surface and bottom surface toward the opposite surface; and a multi-terminal filter disposed within the body interconnecting each the conductors, and the at least one channels.

In still another form a Z-directed multi-terminal component for mounting in a printed circuit board (PCB) having a mounting hole having a depth D therein, comprises an insulative body having a top surface, a bottom surface and side surface, a cross-sectional shape that is insertable into the mounting hole in the PCB and a length L, a multi-terminal filter disposed within the body, a plurality of conductors disposed within the body corresponding to the number of terminals in the multi-terminal filter with one of the plurality of conductors extending from each of the terminals in the multi-terminal filter to one of the top surface of the body and the bottom surface of the body; and each of the top and bottom surfaces further comprising a plurality of conductive traces with one conductive trace electrically connected an end of each of the plurality of conductors adjacent thereto and extending therefrom to an edge of the body.

With these various embodiments, the multi-terminal filter may be one of a T-filter and a Pi filter.

BRIEF DESCRIPTION OF THE DRAWINGS

The above-mentioned and other features and advantages of the various embodiments of the invention, and the manner of attaining them, will become more apparent will be better understood by reference to the accompanying drawings, wherein:

FIG. 1 is an illustration of one embodiment of a Z-directed component;

FIG. 2 illustrates the internal arrangement of elements comprising one embodiment of the Z-directed component of FIG. 1;

FIGS. 3A-3F illustrate various shapes for the body of a Z-directed component;

FIGS. 4A-4C illustrate various channel configurations for a Z-directed component;

FIGS. 5A-5H illustrate various channel and conductor configurations for the body of a Z-directed component;

FIGS. 19A-19C illustrate sectional views of a single conductor differential Z-directed ferrite bead, a 2 conductor differential mode Z-directed ferrite bead, and a 2 conductor common mode Z-directed ferrite bead;

FIGS. 20A and 20B illustrate a Z-directed switch component that can be rotated to connect predetermined circuit paths in a PCB;

FIG. 20B is a sectional illustration of the PCB taken along line 20B-20B of FIG. 20A with the Z-directed switch component removed to show internal connection points of the PCB;

FIG. 20C is an illustration of the Z-directed switch component of FIG. 20A having an internal electronic component;

FIG. 20D is a top view of the Z-directed switch component of FIG. 20C showing alternate configurations of the channel shapes and conductive member and radial projections;

DETAILED DESCRIPTION

Figures 6A, 6B, 6C, 6D:
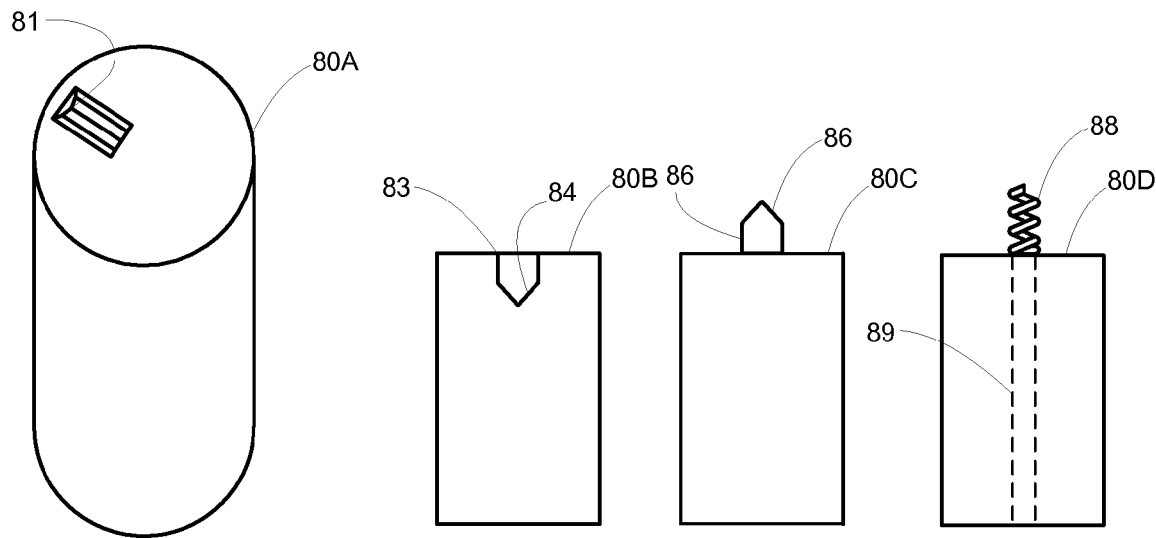
FIGS. 6A-6D illustrate various orienting locating or connection features of a Z-directed component.

The present invention will now be described more fully hereinafter with reference to the accompanying drawing figures, in which some, but not all embodiments of the invention are shown. It is to be understood that the invention is not limited in its application to the details of construction and the arrangement of components set forth in the following description or illustrated in the drawings. The invention may be embodied in many different forms and should not be construed as limited to the embodiments set forth herein; rather, these embodiments are provided so that this disclosure will satisfy applicable legal requirements.

The phraseology and terminology used herein is for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted," and variations thereof herein are used broadly and encompass direct and indirect connections, couplings, and mountings. In addition, the terms "connected" and "coupled" and variations thereof are not restricted to physical or mechanical connections or couplings.

As described in subsequent paragraphs, the specific mechanical configurations illustrated in the drawings are intended to exemplify embodiments of the invention and other alternative mechanical configurations are possible.

This specification describes a family of components that are intended to be embedded or inserted into a printed circuit board (PCB). These components are termed Z-directed components and have been modeled and basic prototypes of many of the components described herein, but lacking the surface channels, were made to establish proof of concept. Not all embodiments described herein have been constructed. An overview of how Z-directed components are intended to be formed is presented initially followed by configurations for Z-directed component designs including but not limited to capacitors, delay lines, transistors, switches, and connectors. This is followed by techniques believed to be useful for assembling PCBs with Z-directed components. Z-directed components occupy less space on the surface of a PCB and for high frequency circuits (e.g. clock rates greater than 1000 MHz) allow for higher frequency of operation.

Overview

As used herein an X-Y-Z frame of reference is used. The X and Y axes describe the plane of a printed circuit board. The Z-axis describes a direction perpendicular to the plane of the circuit board. The top surface of the PCB has a zero Z-value. A component with a negative Z-direction value indicates that the component is inserted into the top surface of the PCB. Such a component may be above (extend past), flush with, or recessed below either the top surface and/or the bottom surface of the PCB. A component having both a positive and negative Z-direction value indicates that the component is partially inserted into the surface of the PCB. Z-directed components are intended to be inserted into a hole or recess in a printed circuit board. Depending on its shape and length more than one Z-directed component may be inserted into a single mounting hole in the PCB, such as being stacked together or positioned side by side. The hole may be a through hole (a hole from the top surface through to the bottom surface) or a well (an opening or recess through either the top or bottom surface into an interior portion or internal layer of the PCB).

As described herein the Z-directed components are illustrated as being inserted into the top surface of the PCB. For a PCB having conductive traces on both external layers, one external layer is termed the top surface and the other the bottom surface. Also where only one external layer has conductive traces, that external surface is referred to as the top surface. The Z-directed components are referred to as having a top surface, a bottom surface and a side surface. The references to top and bottom surfaces of the Z-directed component conform to the convention used to refer to the top and bottom surfaces of the PCB. The side surface of a Z-directed component is in the Z-direction and would be adjacent to the wall of the mounting hole in the PCB which is also in the Z-direction. This use of top, bottom and side should not be taken as limiting how a Z-directed component may be mounted into a PCB. Although the components are described herein as being mounted in a Z-direction, this does not mean that such components are limited to being inserted into a PCB only along the Z-axis. Z-directed components may be mounted normal to the plane of the PCB from the top or bottom surfaces or both surfaces, mounted at an angle thereto or, depending on the thickness of the PCB and the dimensions of the Z-directed component and even inserted into the edge of the PCB between to the top and bottom surfaces of the PCB.

The Z-directed components may be made from various combinations of materials commonly used in electronic components. The signal connection paths will be made from conductors which are materials that have high conductivity. Conducting materials include, but are not limited to, copper, gold, aluminum, silver, tin, lead and many others. Z-directed components will have areas that need to be insulated from other areas by using materials that have low conductivity like plastic, glass, FR4 (epoxy & fiberglass), air, mica, ceramic and others. A Z-directed component that is constructed as a resistor requires materials that have properties that are between a conductor and insulator which have a finite amount of resistivity which is the reciprocal of conductivity. Materials like carbon, doped semiconductor, nichrome, tin-oxide and others are used for their resistive properties. Capacitors are typically made of two conducting plates separated by an insulating material that has a high permittivity (dielectric constant). Permittivity is a parameter that shows the ability to store electric fields in the materials like ceramic, mica, tantalum and others. Inductors are typically made of coils of wires or conductors wrapped around a material with high permeability. Permeability is a parameter that shows the ability to store magnetic fields in the material which are iron and alloys like nickel-zinc, manganese-zinc, nickel-iron and others. Transistors and FET are electronic devices that are made from semiconductors that behave in a nonlinear fashion and are made from silicon, germanium, gallium arsenide and others. Throughout the application there are references that discuss different materials, properties of materials or terminology interchangeably as currently used in the art of material science and electrical component design. Because of the flexibility in how a Z-directed component is constructed and the number of materials that may be used, it is also contemplated that Z-directed components may be constructed of materials that have not been discovered or created to date. The body of a Z-directed component will in general be comprised of a non-conductive material unless otherwise called out in the description for a particular design of a Z-directed component such as a capacitor.

The PCB which use a Z-directed component may be constructed to have a single conductive layer or multiple conductive layers as is known. The PCB may have conductive traces on the top surface only, on the bottom surface only, on both the top and bottom surfaces. In addition one or more intermediate internal conductive trace layers may also be present in the PCB.

Connections between a Z-directed component and the traces in or on a PCB may be accomplished by soldering techniques, screening techniques, extruding techniques or plating techniques as are known in the art. Depending upon application, solder pastes and component adhesives may be used. In some configurations, compressive conductive members may be used to interconnect a Z-directed component to conductive traces found on the PCB.

Z-Directed Components

The most general form of a Z-directed component comprises a body having a top surface, a bottom surface and a side surface, a cross-sectional shape that is insertable into a mounting hole of a given depth D within a PCB with a portion of the body comprising an insulator. All of the embodiments described herein for Z-directed components are based on this general form.

FIGS. 1 and 2 show an embodiment of a Z-directed component. There Z-directed component 10 comprises a generally cylindrical body 12 having a top surface 12$t$, a bottom surface 12$b$, a side surface 12$s$, and a length L generally corresponding to the depth D of the mounting hole. The length L can be less than, equal to or greater than the depth D. In the former two cases, Z-directed component 10 would in one case be below at least one of the top and bottom surfaces of the PCB and in the other it would be flush with the two surfaces of the PCB. Where length L is greater than depth D, Z-directed component 10 would not be flush mounted. However with this non-flush mount, Z-directed component 10 would be capable of being used to interconnect to another component or another PCB that is positioned nearby. The mounting hole is typically a through-hole extending between the top and bottom surfaces of the PCB but it may also be a blind hole. When recessed below the surface of the PCB additional resist areas may be required in the hole of the PCB to keep from plating the entire circumferential area around the hole.

Z-directed component 10 in one form may have at least one conductor 14 extending through the length of body 12. At the top and bottom ends 14$t$ and 14$b$ of conductor 14 top and bottom conductive traces 16$t$, 16$b$ are provided on the top and bottom end surfaces 12$t$, 12$b$ of body 12 and extend from respective ends of the conductor 14 to the edge of Z-directed component 10. In this embodiment body 12 comprises a non-conductive material. Depending on its function, body 12 of Z-directed component 10 may be made of a variety of materials having different properties. These properties include being conductive, resistive, magnetic, dielectric, or semiconductive or various combinations of properties as described herein. Examples of materials that have the properties are copper, carbon, iron, ceramic or silicon, respectively. Body 12 of Z-directed component 10 may also comprise a number of different networks needed to operate a circuit that will be discussed later.

One or more longitudinally extending channels or wells may be provided on the side surface of body 12 of Z-directed component 10. The channel may extend from one of the top surface and the bottom surface of body 12 toward the opposite surface. As illustrated two concave wells or channels 18 and 20 are provided in the outer surface of Z-directed component 10 extending the length of body 12. When plated or soldered, these channels allow electrical connections to be made to Z-directed component 10, through the PCB, as well as to internal conductive layers within the PCB. The length of the channels 18 or 20 may extend less than the entire length of body 12.

FIG. 2 shows the same component as in FIG. 1 but with all the surfaces transparent. The conductor 14 is shown as a cylinder extending through the center of Z-directed component 10. Other shapes may also be used for conductor 14. Traces 16t and 16b can be seen extending from conductor ends 14t and 14b, respectively to the edge of body 12 is a conductor that connects the top trace 16t to the bottom trace 16b. While traces 16t and 16b are shown as being in alignment with one another (zero degrees apart) this is not a requirement and they may be positioned as needed for a particular design. For example traces 16t and 16b may be 180 degrees apart or 90 degrees apart and any all increments therein.

Body shape may be any shape that can fit into a mounting hole in a PCB. FIGS. 3A-3F illustrate possible body shapes for a Z-directed component. FIG. 3A shows a triangular cross-sectional body 40; FIG. 3B a rectangular cross sectional body 42; FIG. 3C a frusto-conical body 44; FIG. 3D an ovate cross sectional cylindrical body 46; and FIG. 3E a cylindrical body 48. FIG. 3F is a stepped cylindrical body 50 where one portion 52 has a larger diameter than another portion 54. With this arrangement the Z-directed component may be mounted on the surface of the PCB while having a section being inserted into the mounting hole provided in the PCB. The edges of Z-directed component may be beveled to help with aligning the Z-directed component for insertion into a through-hole in a PCB. Other shapes and combinations of those illustrated may also be used for a Z-directed component.

For a Z-directed component, the channels for plating can be of various cross-sectional shapes and lengths. The only requirement is that plating or solder material make the proper connections to the Z-directed component and corresponding conductive traces in or on the PCB. Channels 18 or 20 may have, for example, V-, C- or U-shaped cross sections, semi-circular or elliptical cross sections. Where more than one channel is provided, each channel may have a different cross-sectional shape. FIGS. 4A-4C illustrate three channel shapes. In FIG. 4A V-shaped channels 60 are shown. In FIG. 4B, U- or C-shaped channels 62 are shown. In FIG. 4C, wavy or irregular cross-sectional channel shapes 65 are shown.

The numbers of layers in a PCB varies from being single sided to being over 22 layers and may have different overall thickness that range from less than 0.051 inch to over 0.093 inch or more. Where a flush mount is desired the length of the Z-directed component will depend on the thickness of the PCB into which it is intended to be inserted. The Z-directed component's length may also vary depending on the intended function and tolerance of a process. The preferred lengths will be where the Z-directed component is either flush with the surfaces or extends slightly beyond the surface of the PCB. This would keep the plating solution from plating completely around the interior of the PCB hole that may cause a short in some cases. It is possible to add a resist material around the interior of a PCB hole to only allow plating in the desired areas. However, there are some cases where it is desired to completely plate around the interior of a PCB hole above and below the Z-directed component. For example if the top layer of the PCB was a Vcc plane and the bottom layer is a GND plane then a decoupling capacitor would have lower impedance if the connection used a greater volume of copper to make the connection.

There are number of features that can be added to a Z-directed component to create different mechanical and electrical characteristics. The number of channels or conductors can be varied from zero to any number that can maintain enough strength to take the stresses of insertion, plating, manufacturing processes and operation of the PCB in its intended environment. The outer surface of a Z-directed component may have a coating that glues it in place. Flanges or radial projections may also be used to prevent over or under insertion of a Z-directed component into the mounting hole, particularly where the mounting hole is a through-hole. A surface coating material may also be used to promote or impede migration of the plating or solder material.

A Z-directed component may take on several roles depending on the number of ports or terminals needed to make connections to the PCB. Some possibilities are shown in FIGS. 5A-H. FIG. 5A is a Z-directed component configured as 0-port device 70A used as a plug so that if a filter or a component is optional then the plug stops the hole from being plated. After the PCB has been manufactured, the 0-port device 70A may be removed and another Z-directed component may be inserted, plated and connected to the circuit. FIGS. 5B-5H illustrates various configurations useful for multi-terminal devices such as resistor, diode, transistor, clock circuit. FIG. 5B shows a 1-port or single signal Z-directed component 70B having a conductor 71 connected to top and bottom conductive traces 72t, 72b. FIG. 5C shows a 1-port 1-channel Z-directed component 70C where one plated well or channel 73 is provided in addition to conductor 71 and top and bottom conductive traces 72t and 72b. FIG. 5D shows a Z-directed component 70D having two wells 73 and 75 in addition to conductor 71 and top and bottom traces 72t, 72b. The Z-directed component 70E of FIG. 5E has three wells 73, 75 and 76 in addition to conductor 71 and top and bottom traces 72t, 72b. FIG. 5F shows Z-directed component 70F having two conductors 71 and 77 each with their respective top and bottom traces 72t, 72b and 78t, 78b and no channels or wells. Z-directed component 70F is a two signal device to be primarily used for differential signaling. FIG. 5G shows a Z-directed component 70G having one well 73 and two conductors 71 and 77 each with their respective top and bottom traces 72t, 72b and 78t, 78b. FIG. 5H shows Z-directed component 70H having one conductor 71 with top and bottom traces 72t, 72b and a blind well or partial well 78 extending from the top surface along a portion of the side surface that will allow the plating material or solder to stop at a given depth. For one skilled in the art, the number of wells and signals is only limited by the space, required well size and conductor sizes.

In most cases Z-directed components will need to be orientated correctly when inserted into a PCB. Accordingly, locating or orienting features and connections features may be provided. FIGS. 6A-6C illustrate examples of such locating features while FIG. 6D illustrates a connection feature. In FIG. 6A, Z-directed component 80A has a V-notch 81 on an end surface extending radially outward. In FIG. 6B, Z-directed component 80B has a recess 83 on an end surface of Z-directed component 80B having an orienting surface 84. FIG. 6C shows Z-directed component 80C having an axial projection, peg 85, extending axially outward from an end surface and having an orienting surface 86. An ink mark or other visual or magnetic indicator on a end surface or on the side of a Z-directed component may also be used to orient a Z-directed component such as when using a camera.

As shown in FIG. 6D, Z-directed component 80D may be fitted with a connection feature such as a conductive pad, a spring loaded style pogo-pin or even a simple spring 88 that may be used to add an additional electrical connection (such as frame ground) point to a printed circuit board. Spring 88 is illustrated as being connected to conductor 89 of Z-directed component 80D.

Figures 7A, 7B:
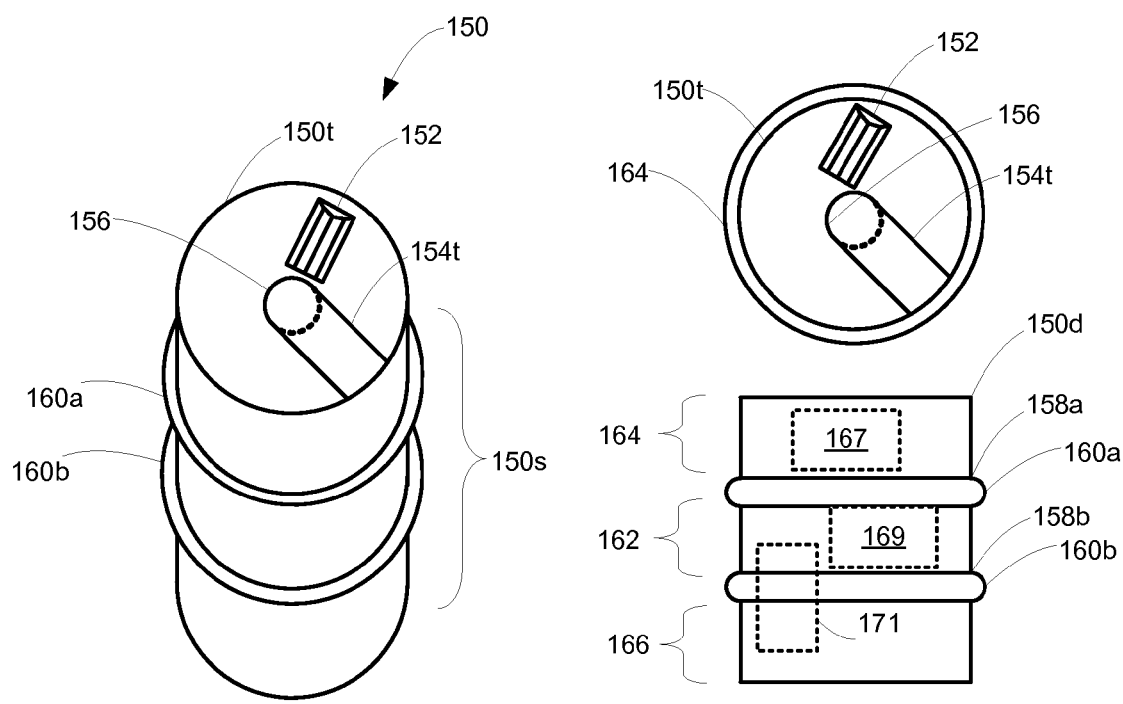
FIGS. 7A and 7B illustrate a Z-directed component having O-rings for connecting to internal layers of a PCB and having a body having regions comprised of similar and or dissimilar materials.

FIGS. 7A and 7B illustrate another configuration for a Z-directed component utilizing O-rings for use in a PCB having a top and bottom conductive layer and at least one internal conductive layer. Z-directed component 150 is shown having on its top surface 150$t$, a locating feature 152 and conductive top trace 154$t$ extending between conductor 156 and the edge of body 150$d$ on its top surface 150$t$. (A conductive bottom trace not shown is provided on the bottom surface). Conductor 156 extends through a portion of the body 150$d$ as previously described. Located on the side surface 150$s$ of body 150$d$ is at least one semi-circular channel or grove. As shown a pair of axially spaced apart circumferential channels 158$a$, 158$b$ are provided having O-rings 160$a$, 160$b$, respectively disposed within channels 158$a$, 158$b$. A portion of the O-rings extend out beyond the side surface 150$s$ of the body 150$d$. O-rings 160$a$, 160$b$ would be positioned adjacent one or more of the internal layers of the PCB to make electrical contact to one or more traces provided at that point in the mounting hole for the Z-directed component. Depending on the design an O-ring would not have to be provided adjacent every internal layer.

O-rings 160$a$, 160$b$ may be conductive or non-conductive depending on the design of the circuit in which they are used. O-rings 160$a$, 160$b$ preferably would be compressive helping to secure Z-directed component 150 within the mounting hole. The region 162 of body 150$d$ intermediate O-rings 160$a$, 160$b$ may be comprised of different material than the regions 164 and 166 of the body 150$d$ outside of the O-rings. For example if the material of region 162 is of a resistive material and O-rings 160$a$, 160$b$ are conductive, then internal circuit board traces in contact with the O-rings see a resistive load.

Regions 164 and 166 may also be comprised of a material having different properties from each other and region 162. For example region 164 may be resistive, region 162 capacitive and region 166 inductive. Each of these regions can be electrically connected to the adjoining layers of the PCB. Further conductor 156 and traces 154$t$, 154$b$ do not need to be provided. So for the illustrated construction, between the top layer of the PCB and the first internal layer from the top, a resistive element may be present in region 164, a capacitive element between the first internal layer and the second internal layer in region 162 and an inductive element between the second internal layer and the bottom layer of the PCB in region 166. Accordingly, for a signal transmitted from an internal trace contacting conductive O-ring 160$a$ and to a second internal trace contacting conductive O-ring 160$b$, the signal would see an inductive load. The material for regions 162, 164, 166 may have properties selected from a group comprising conductive, resistive, magnetic, dielectric, capacitive or semiconductive and combinations thereof. The design may be extended to circuit boards having fewer or more internal layers than that described without departing from the spirit of the invention.

Figure 8:
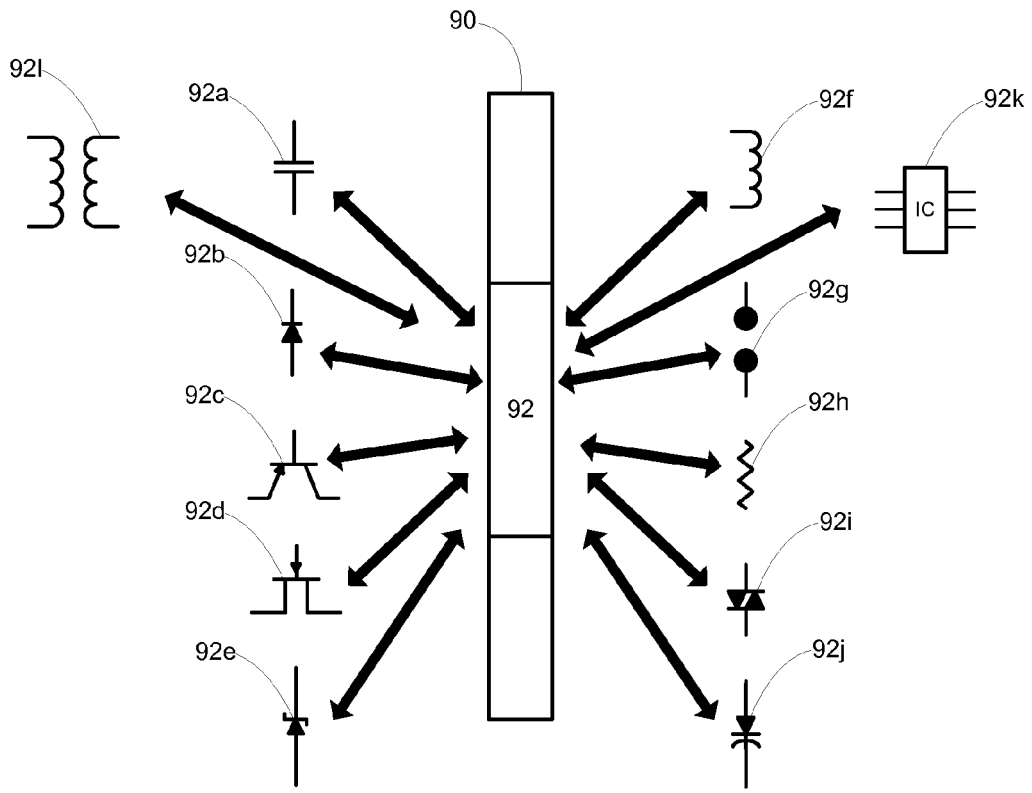
FIG. 8 illustrates various elements or electronic components such as a resistor, diode, capacitor that may be provided within the body of a Z-directed component in series with a conductor.
Figures 9, 10:
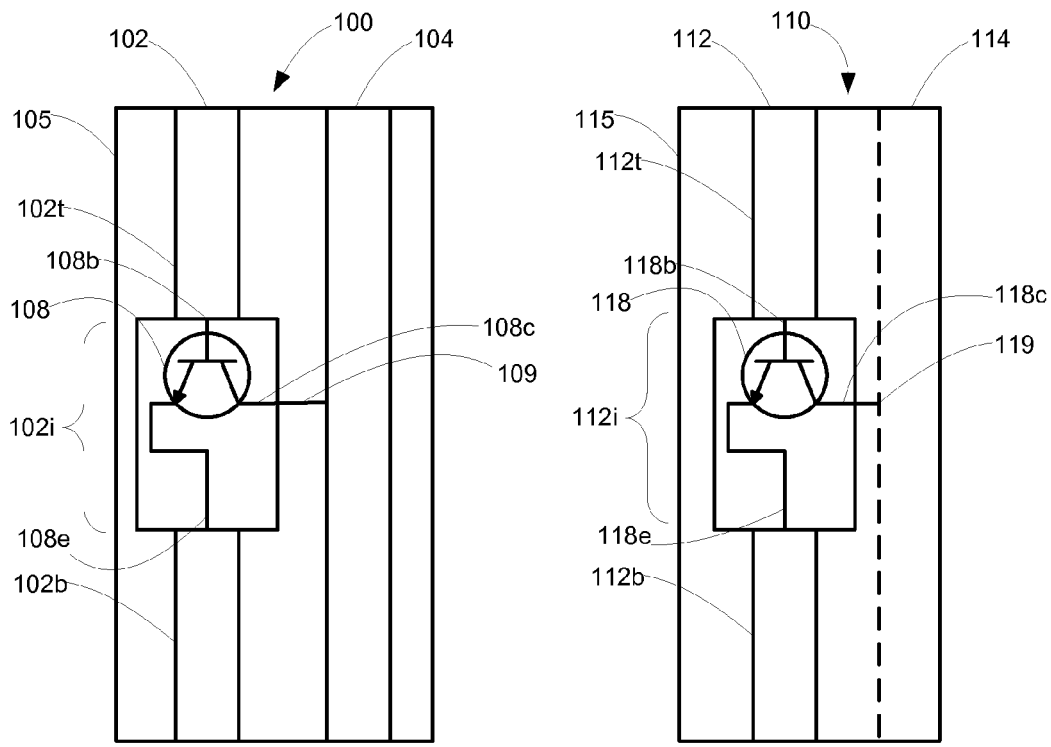
FIG. 9 illustrates a Z-directed component having a 3-terminal transistor connected to two conductors.
FIG. 10 illustrates an alternate embodiment of a Z-directed component having a 3-terminal transistor connected to a conductor and a plated channel.

In addition regions 162, 164, 166 may have electronic components 167, 169, 171 embedded therein and connected as described herein with respect to FIGS. 7-9. Also as illustrated for component 171 a component may be found within one or more regions within the body of a Z-directed component. Internal connections may be provided from embedded components to O-rings 160$a$, 160$b$. Alternatively internal connections may be provided from the embedded components to plateable pads provided on the side surface 150$s$.

The various embodiments discuss for a Z-directed component are meant to be illustrative and not limiting. A Z-directed component may be made of a bulk material that performs a network function or may have other parts embedded into its body.

Z-Directed Component Examples

Given that a Z-directed component may be a multi-terminal device, it is clear that it may be used to perform, but not limited to, the following functions: transmission line; delay line; T filter; decoupling capacitor; inductor; common made choke; resistor; differential pair pass through; differential ferrite bead; diode; ESD protection devices (varistors). Also note that combinations may be put together within one component.

General Z-Directed Component Design

FIG. 8 illustrates various configurations for a conductor in a Z-directed component. As shown conductor 90 has a region 92 intermediate the ends comprising a material having properties selected from a group comprising conductive, resistive, magnetic, dielectric, capacitive or semiconductive properties and combinations thereof. These materials form a variety of components. Additionally a component may be inserted or embedded into region 92 with portions of the conductor extending from the terminals of the component. A capacitor 92$a$ may be provided in region 92. Similarly a diode 92$b$, a transistor 92$c$, a mosfet 92$d$, a zener diode 92$e$, an inductor 92$f$, a surge suppressor 92$g$, a resistor 92$h$, a diac 92$i$ and a varactor 92$j$ and combinations of these items are further examples of materials that provided in region 92 of conductor 90. While region 92 is shown as being centered within the conductor 90 it is not limited to that location.

For multi-terminal devices such as three terminal devices transistor 92$c$ or mosfet 92$d$, or integrated circuit 92$k$, or a transformer 92$l$, one portion of the conductor may be between the top surface trace and to a first terminal of the device, the other portion of the conductor between the bottom surface trace and a second terminal of the device. For additional device terminals, additional conductors may be provided in the body of the Z-directed component to allow electrical connection to the remaining terminals or additional conductive traces may be provided within the body of the Z-directed component between the additional terminals and channels on the side surface of the body of a Z-directed component allowing electrical connection to an external conductive trace. Various connection configurations to a multiple terminal device may be used in a Z-directed component.

FIGS. 9 and 10 illustrate two exemplary connection configurations for a transistor. In FIG. 9, a Z-directed component, 100, similar to that shown in FIG. 5F, having two conductors 102 and 104 in body 105. Conductor 102 comprising a top portion 102$t$, a bottom portion 102$b$ and an intermediate region 102$i$ wherein transistor 108 is provided. The base 108$b$ of transistor 108 is electrically connected to the top portion 102$t$ of conductor 102 while the emitter 108$e$ is connected to the bottom portion 102$b$ of conductor 102. The collector 108$c$ is connected to conductor 104 via conductive trace 109. In FIG. 10, Z-directed component 110, similar to that shown in FIG. 5C, has body 115 including conductor 112 and channel 114. Conductor 112 comprises a top portion 112$t$, a bottom portion 112$b$, and an intermediate region 112$i$ wherein transistor 118 is provided. The base 118$b$ of transistor 118 is electrically connected to the top portion 112$t$ of conductor 112 while the emitter 118$e$ is connected to the bottom portion 112$b$ of conductor 112. The collector 118$c$ is connected by conductive trace 119 to channel 114 which is plated. The examples shown in FIGS. 8 and 9 may be extended to additional channels and conductors allowing for use of multi-terminal circuits. The connections are intended only to illustrate how connections to a multi-terminal component may be accomplished and are not meant to limit how a transistor may be connected within a Z-directed component.

Z-Directed Signal Pass-Through Component

Figure 11:
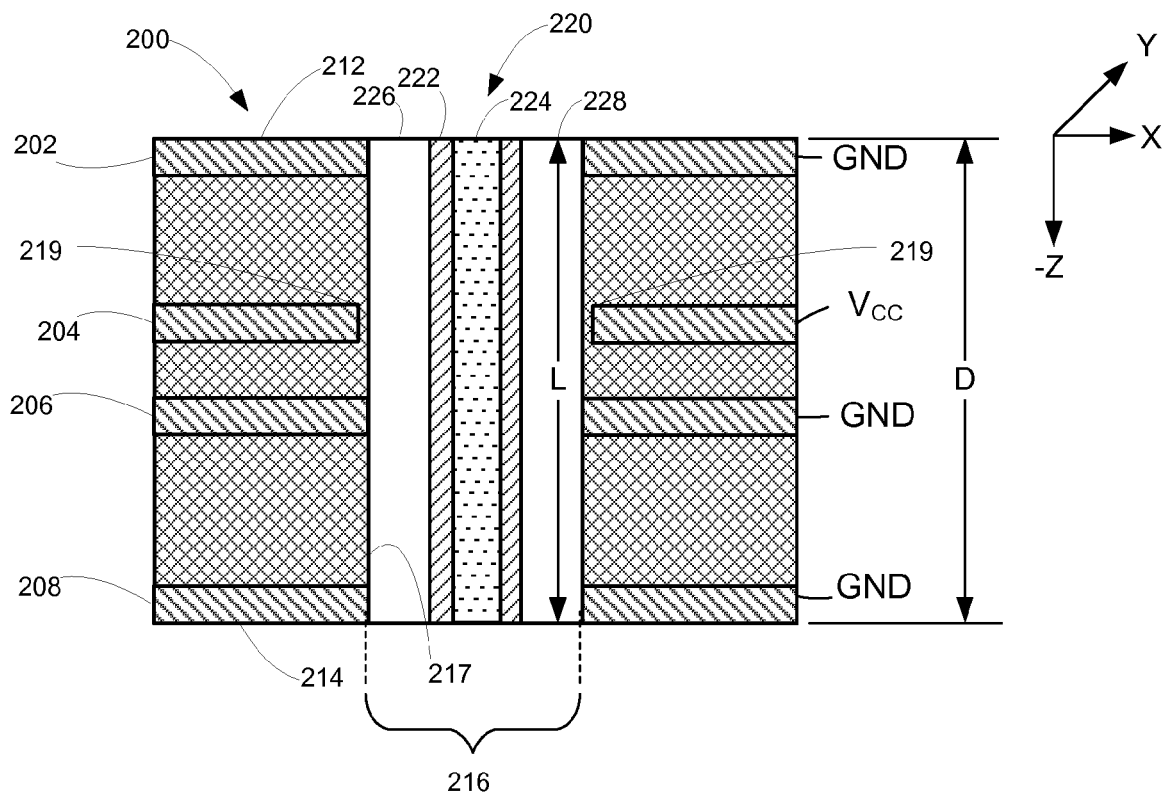
FIG. 11 illustrates a cross-sectional view of the embodiment of a Z-directed component flush mounted within a PCB shown in FIG. 12.
Figure 12:
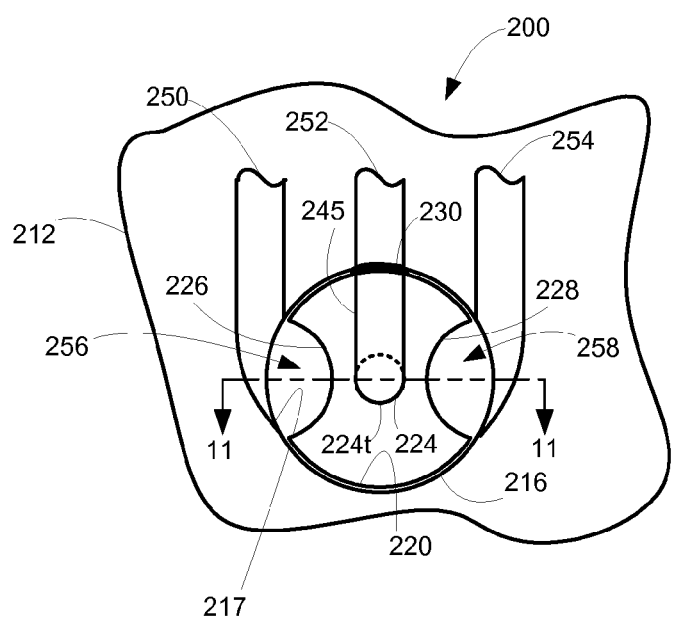
FIG. 12 illustrates a top view of the PCB and the Z-directed component of FIG. 11 showing the conductive traces and connections to the Z-directed component.

Reference is now made to FIGS. 11 and 12 illustrating a Z-directed component termed a signal pass-through that is used for passing a signal trace from the top surface of a PCB to the bottom surface. FIG. 11 shows a sectional view taken along line 11-11 in FIG. 12 of a PCB 200 having 4 conductive planes or layers comprising, from top to bottom, a ground (GND) plane or trace 202, a voltage supply plane Vcc 204, a second ground GND plane 206 and a third ground GND plane or trace 208 separated by nonconductive material such as a phenolic plastic such as FR4 which is widely used as is known in the art. PCB 200 may be used for high frequency signals. The top and bottom ground planes or traces, 202 and 208 respectively, on the top and bottom surfaces 212 and 214, respectively, of PCB 200 are connected to conductive traces leading up to Z-directed component 220. A mounting hole 216 having a depth D in a negative Z direction is provided in PCB 200 for the flush mounting of Z-directed component 220. Here depth D corresponds to the thickness of PCB 200; however depth D may be less than the thickness of PCB 200 creating a blind hole therein. Mounting hole 216, as illustrated, is a through-hole that is round in cross-section to accommodate Z-directed component 220 but may have cross sections to accommodate the insertion of Z-directed components having other body configurations. In other words, mounting holes are sized so that Z-directed components are insertable therein. For example, a Z-directed component having a cylindrical shape may be inserted into a square mounting hole and vice versa. In the cases where Z-directed component does not make a tight fit, resist materials will have to be added to the areas of the component and PCB where copper plating is not desired.

Z-directed component 220 is illustrated as a three lead component that is flush mounted with respect to both the top surface 212 and bottom surface 214 of PCB 200. Z-directed component 220 is illustrated as having a generally cylindrical body 222 of a length L. A center conductor or lead 224, illustrated as being cylindrical, is shown extending the length of body 222. Two concave wells or channels 226 and 228, that define the other two leads, are provided on the side surface of Z-directed component 220 extending the length of body 222. Channels 226 and 228 are plated for making electrical connections to Z-directed component 220 from various layers of PCB 200. As shown the ground plane traces on layers 202, 206, and 208 of PCB 100 are electrically connected to channels 226 and 228. Vcc plane 204 does not connect to Z-directed component 220 as shown by the gap 219 between Vcc plane 204 and wall 217 of mounting hole 216.

FIG. 12 illustrates a top view of Z-directed component 220 in PCB 200. Three conductive traces 250, 252 and 254 are shown leading up to the edge of wall 217 of mounting hole 216. As illustrated, trace 252 serves as a high-frequency signal trace to be passed from the top surface 212 to the bottom surface 214 of PCB 200 via. Z-directed component 220. Conductive traces 250 and 254 serve as ground nets. Center lead or conductor 224 is electrically connected to trace 252 on the top surface 212 of PCB 200 by a top trace 245 and plating bridge 230. Top trace 245 on the top surface of Z-directed component 220 extends from the top end 224t of conductor 224 to the edge of Z-directed component 220. Although not shown, the bottom side of Z-directed component 220 and bottom surface 214 of PCB 200 is configured in a similar arrangement of traces as shown on top surface 212 of PCB 200 illustrated in FIG. 12. A bottom trace on the bottom surface of Z-directed component 220 extends from the bottom of conductor 224 to the edge of Z-directed component 220. A plating bridge is used to make the electrical connection between the bottom trace and another high frequency signal trace provided on the bottom surface of PCB 200. The transmission line impedance of the Z-directed component can be adjusted to match the PCB trace impedance by controlling the conductor sizes and distances between each conductor which improves the high speed performance of the PCB.

During the plating process, wells 256 and 258 formed between wall 217 of mounting hole 216 and channels 226 and 228 allow plating material or solder pass from the top surface 212 to the bottom surface 214 electrically interconnecting traces 250 and 254, respectively to channels 226 and 228, respectively, of Z-directed component 220 and also to similarly situated traces provided on the bottom surface 214 of PCB 200 interconnecting ground planes or traces 202, 206 and 208. The plating is not shown for purposes of illustrating the structure. In this embodiment Vcc plane 204 does not connect to Z-directed component 220.

One of the challenges for high frequency signal speeds is the reflections and discontinuities due to signal trace transmission line impedances changes. Many PCB layouts try to keep high frequency signals on one layer because of these discontinuities caused by the routing of signal traces through the PCB. Standard vias through a PCB have to be spaced some distance apart which creates high impedance between the signal via and the return signal via or ground via. As illustrated in FIGS. 11 and 12, the Z-directed component and the return ground or signals have a very close and controlled proximity that allows essentially constant impedance from the top surface 212 to the bottom surface 214 of PCB 200.

Figure 13:
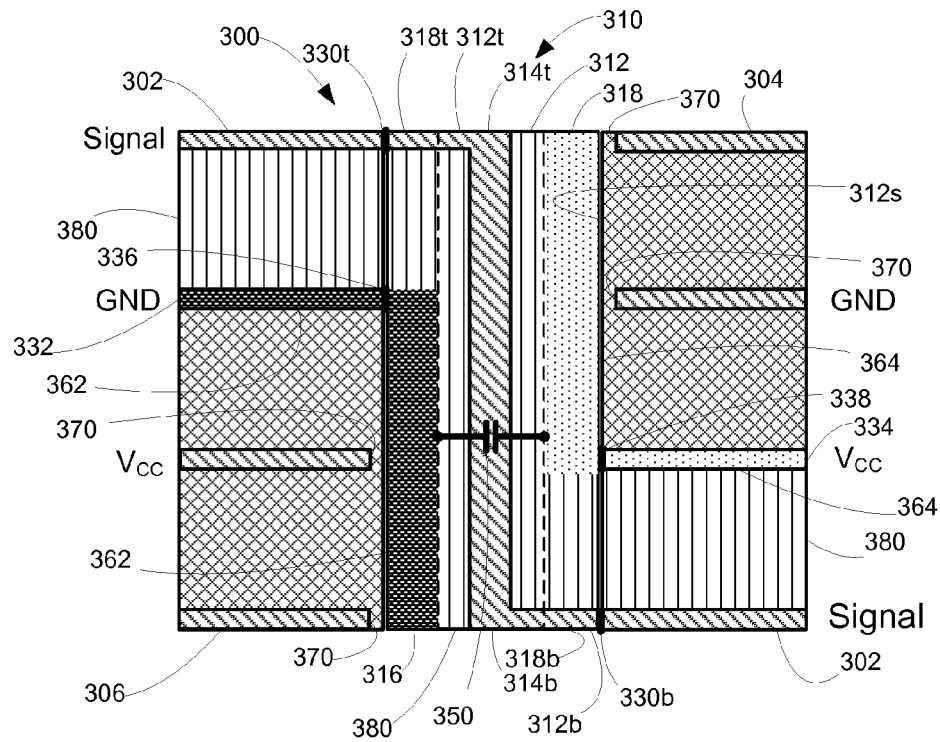
FIG. 13 illustrates ground loops for the Z-directed component of FIGS. 11 and 12 with the Z-directed component further comprising a decoupling capacitor within the body of the Z-directed component.

A Z-directed signal pass through component may also comprise a decoupling capacitor that will allow the reference plane of a signal to switch from a ground plane, designated GND, to a voltage supply plane, designated Vcc, without having a high frequency discontinuity. FIG. 13 shows a cross-sectional view of a typical 4-layer PCB 300 with a signal trace 302 transferring between the top layer 304 and the bottom layer 306. Z-directed component 310, similar to that shown in FIG. 5D, having body 312 connects signal trace 302 through center conductor 314. Z-directed component 310 also comprises plated channels 316 and 318 extending along the side surface 312s of the body 312. The top 314t and bottom 314b of conductor 314 are connected to conductive traces 318t and 318b on the top 312t and bottom 312b of body 312. These in turn are connected to signal trace 302 via top and bottom plating bridges 330t and 330b. Channels 316 and 318 will be plated to GND plane 332 and Vcc plane 334, respectively. Connection points 336 and 338, respectively, illustrate this electrical connection. Schematically illustrated decoupling capacitor 350 is internal to body 312 and is connected between channels 316 and 318. Decoupling capacitor 350 may be a separate capacitor integrated into the body 312 of Z-directed component 310 or it can be formed by fabricating a portion of the body 312 of Z-directed component 310 from the required materials with dielectric properties between conductive surfaces.

The path for signal trace 302 is illustrated with diagonal hatching and can be seen to run from top layer 304 to bottom layer 306. GND plane 332 and channel 316 are electrically connected at 336 with the signal path return indicated by the dark stippling 362. Vcc plane 334 and channel 318 are electrically connected at 338 with the signal path return indicated by the light stippling 364. As is known in the art where a signal plane or trace is not to be connected to the inserted part those portions are spaced apart from the component as shown at 370. Where a signal plane or trace is to be connected to an inserted component, the signal plane or trace is provided at the wall or edge of the opening to allow the plating material or solder to bridge therebetween as illustrated at points 330*t*, 330*b*, 336, and 338.

The vertically hatched portion 380 shows the high speed loop area between the signal trace and return current path described by the signal trace 302 and the GND plane 332 or Vcc plane 334. The signal trace 302 on the bottom surface 306 is referenced to power plane Vcc 334 that is coupled to the GND plane 332 through decoupling capacitor 350. This coupling between the two planes will keep the high frequency impedance close to constant for the transition from one return plane to another plane of a different DC voltage.

Figure 14:
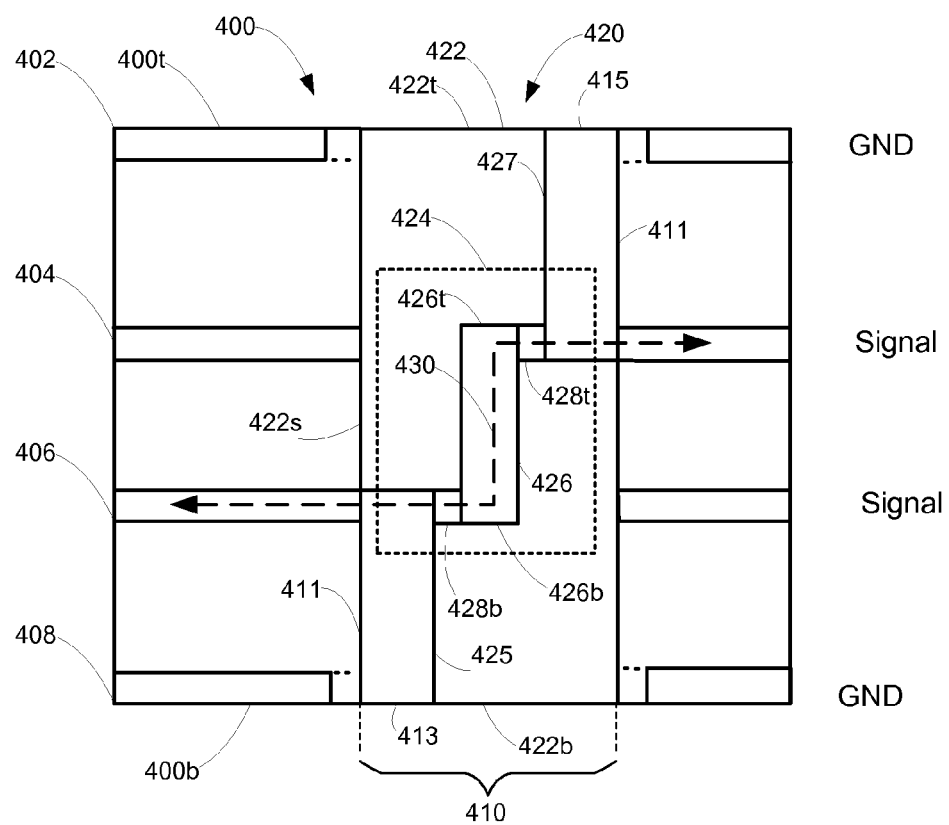
FIG. 14 is an illustration of a Z-directed component for transferring a signal trace from one internal layer of a PCB to another internal layer of that PCB.

Internally mounting Z-directed components in a PCB greatly facilitate the PCB technique of using outer ground planes for EMI reduction. With this technique, signals are routed on the inner layers as much as possible. FIG. 14 illustrates one embodiment of this technique. PCB 400 is comprised of, from top to bottom, top ground layer 402, internal signal layer 404, internal signal layer 406 and bottom ground layer 408. Ground layers 402 and 408 are on the top and bottom surfaces 400*t* and 400*b* of PCB 400. A mounting hole 410 shown as a through-hole extends between the top and bottom surfaces 400*t* and 400*b*. Z-directed component 420 is shown flush mounted in PCB 400. Z-directed component 420 comprises body 422 having a center region 424 intermediate the top 422*t* and bottom 422*b* of body 422 and two channels 425 and 427 on side surface 422*s*.

The channels 425 and 427 and wall 411 of hole 410 form plating wells 413 and 415 respectively. Center region 424 is positioned within body 422 and extends a distance approximately equal to the distance separating the two internal signal layers 404 and 406. Channel 425 extends from the bottom surface 422*b* of body 422 to internal signal level 406 while channel 427 extends from top surface 422*t* of body 422 to internal signal level 404. Here channels 425 and 427 extend only along a portion of side surface 422*s* of body 422. Conductor 426 extends through center region 424 but does not extend to the top and bottom surfaces 422*t*, 422*b* of body 422. FIG. 5H illustrates a partial channel similar to channel 427. Conductor 426 has conductive traces 428*t* and 428*b* extending from the top 426*t* and bottom 426*b* of conductor 426 to channels 427 and 425, respectively. While illustrated as separate elements conductor 426 and traces 428*t*, 428*b* may be one integrated conductor electrically interconnecting channels 425, 427. As shown conductive trace 428*b* is connected to internal signal layer 406 via plated channel 425 and well 413 while trace 428*t* connects to internal signal level 404 via channel 427 and well 415. Ground layers 402 and 408 are not connected to Z-directed component 420 and are spaced away from mounting hole 410 as previously described for FIGS. 11 and 13. As shown by double headed dashed arrow 430, a signal on signal layer 406 can be via'd to signal layer 404 (or vice versa) via Z-directed component through a path extending from well 413, channel 425, trace 428*b*, conductor 426, trace 428*t*, channel 427, and well 415 to allow the signal to remain on the inner layers of PCB 400 with ground layers 402 and 408 providing shielding.

Z-Directed Decoupling Capacitors

Figure 15:
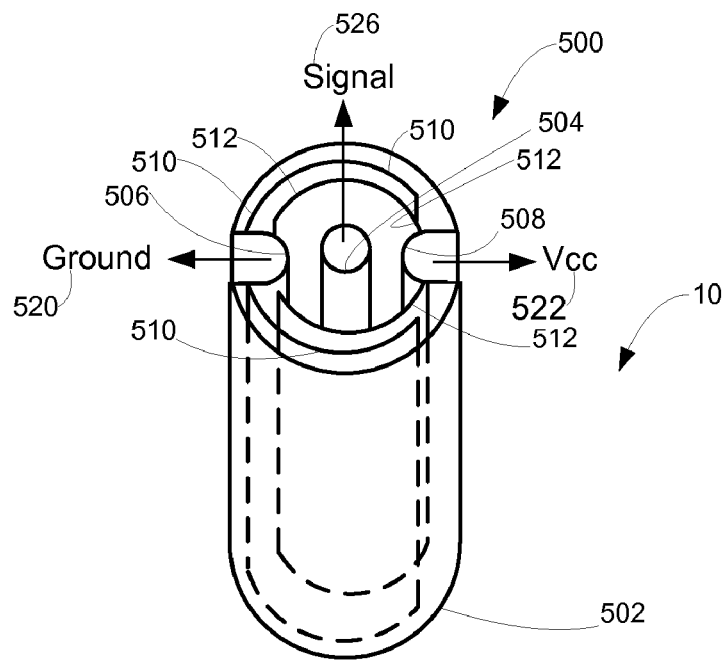
FIG. 15 is an illustration of one embodiment of a Z-directed capacitor comprising semi-cylindrical sheets.

Capacitors having a Z-directed component body type may be constructed in several ways. In FIG. 15 a Z-directed capacitor 500 is shown with body 502 having a conductor 504 and two channels 506 and 508 extending its length similar to those previously described. Conductor 504 is shown connected to a signal 526. Vertically oriented interleaved partial cylindrical sheets 510, 512 forming the plates of Z-directed capacitor 500 are connected to reference voltages such as voltage Vcc and ground (or any other signals requiring capacitance) are used with intervening layers of dielectric material (not shown). Partial cylindrical sheet 510 is connected to plated channel 506 which is connected to Ground 520. Partial cylindrical sheet 512 is connected to plated channel 508 that is shown connected to supply voltage Vcc 522. The sheets 510, 512 may be formed of copper, aluminum or other material with high conductivity. The material between the partial cylindrical sheets is a material with dielectric properties. Only one partial cylindrical sheet is shown connected to each of Vcc 522 and ground 520, however additional partial cylindrical sheets may be provided to achieve the desired capacitance/voltage rating.

Figure 16:
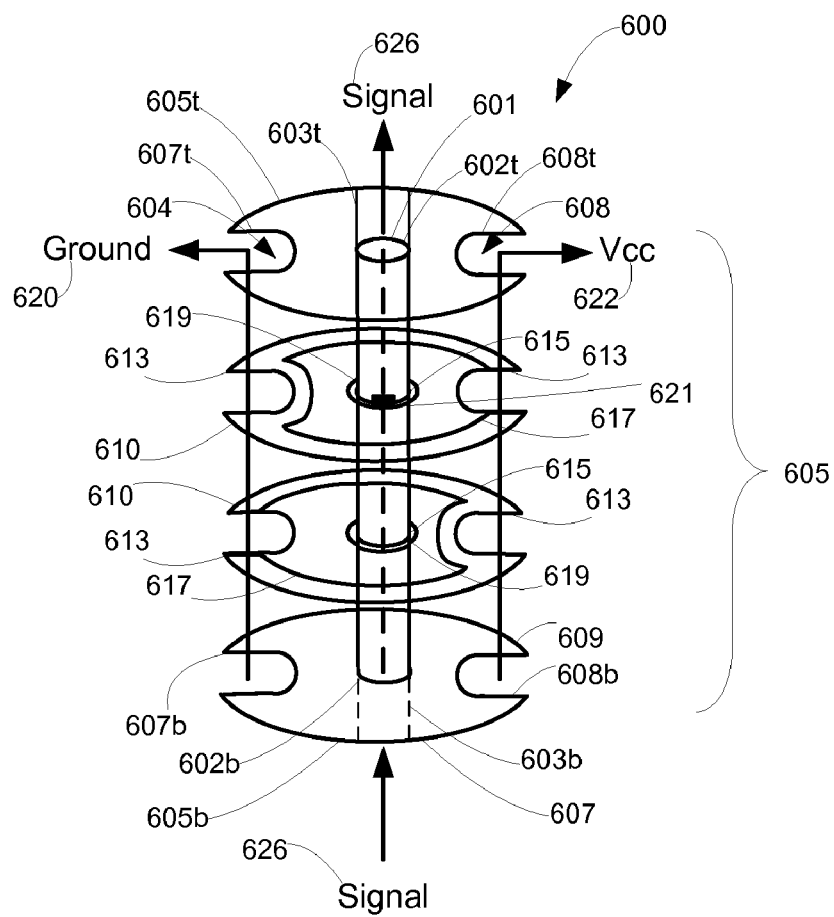
FIG. 16 is an exploded view illustration of another embodiment of a Z-directed capacitor comprising stacked discs.

Another embodiment of a Z-directed capacitor is shown in FIG. 16 using stacked support members connected to voltage Vcc or ground. Z-directed capacitor 600 is comprised of center conductor 601, and a body 605 comprised of a top member 605*t*, a bottom member 605*b*, plurality of support members 610 (illustrated as disks) between the top and bottom members 605*t*, 605*b*.

Center conductor 601 extends through openings 615 in the assembled Z-directed capacitor 600 and openings 602*t* and 602*b*, all of which are sized to closely receive the center conductor. The center conductor is electrically connectable to conductive traces 603*t* and 603*b* on the top and bottom portions 605*t*, 605*b* forming a signal path for signal 626. This connection is made by plating or soldering. Conductor 601 is connected to signal 626 via conductive trace 603*t*. The bottom end of conductor 601 is connected in a similar fashion to a signal trace (not shown) via conductive trace 603*b*.

Opposed openings 607*t* and 608*t* are provided at the edge on top portion 605*t*. Bottom portion 607 is of similar construction as top portion 605 having opposed openings 607*b* and 608*b* provided at the edge. Between top and bottom portions 605, 609 are a plurality of support members 610, which provide the capacitive feature. Support members 610 each have at least one opening 613 at their outer edge and an inner hole 615 allowing for passage of conductor 602 therethrough. As shown two opposed openings 613 are provided in each support member 610. When assembled the opposed openings 607*t*, 607*b*, 608*t*, 608*b*, and 613 align to form opposed channels 604 and 608 extending along the side surface of Z-directed capacitor 600. Channel 604 is shown connected to reference voltage such as ground 620 and channel 606 to another reference voltage such as Vcc 622. Support members 610 may be fabricated from a dielectric material and may be all of the same or varying thickness allowing for choice in designing the desired properties for Z-directed capacitor 600.

Annular plating 617 is provided on one of top and bottom surfaces of support member 610 or if desired on both surfaces. As shown annular plating is shown on the top surface of each support member but location of the annular plating can vary from support member to support member. Annular plating 617 generally conforms to the shape of the support member and extends from one of the edge opening 613 toward the other if an additional opening is provided. The annular plate 617 is of a diameter or dimension or overall size that is less than the diameter, dimension or overall size of support member 610 on which it is affixed. While the plate 617 is described as annular, other shapes may also be used provided that the plating does not contact the center conductor or extend to the edge of the support member on which it is plated or otherwise affixed. The annular plate does contact one of the edge openings 613 but is spaced apart from the other openings, if more than one channel is present in the side surface of the body of Z-directed capacitor 600. Also there is an opening 619 in annular plate 617 having a larger diameter than opening 615 in annular plate 617 through which conductor 601 passes. Opening 619 has a larger diameter than that of conductor 602 leaving annular plate 617 spaced apart from conductor 602.

As illustrated the support members 610 are substantially identical except that when stacked alternate members are rotated 180 degrees with respect to the member above or below it. This may be referred to as a 1-1 configuration. In this way, alternate members will be connected to one or the other of the two channels. As shown in FIG. 16, the annular plating on the upper one of the two support members 610 is connected to channel 608 and voltage Vcc 622 while the annular plating on the lower one of the two support members 610 is connected to channel 604 and ground 620. Other support member arrangements may also be used such as having two adjacent members connected to the same channel with the next support member being connected to the opposite channel which may be referred to as a 2-1 configuration. Other configurations may include 2-2, 3-1 and are a matter of design choice. The desired capacitance or voltage rating determines the number of support members that are inserted between top and bottom portions 605, 609. Although not shown, dielectric members comprised of dielectric material and similarly shaped to support members 610 may be interleaved with support members 610. Based on design choice only a single channel may be used or more channels may be provided, the annular plating may be brought into contact with the center conductor and not in contact with the channels. Again the embodiments for Z-directed capacitors are for purposes of illustration and are not meant to be limiting.

With either design for a Z-directed capacitor, a second conductor may be provided in parallel with the first conductor that is disposed within the conductive plates to create a differential decoupling capacitor. Another embodiment of a Z-directed capacitor can be constructed from FIG. 15 or FIG. 16 by connecting center conductor to one of the reference voltages at each support member that also has its annular plating connected to the same reference voltage. This may be accomplished simply by connecting the conductor to the annular plating as schematically illustrated by the jumper 621. In practice the annular opening 619 in the annular plate 617 would be sized so that the annular plate and conductor 602 would be electrically connected. This component may be placed directly below a power pin or ball of an integrated circuit or other surface mounted component for optimum decoupling placement. The conductive traces on the top and bottom surfaces that are electrically connected to the ends of the conductor would not extend to the edge of the body in this embodiment.

Z-Directed Signal Delay Line

Figures 17A, 17B, 17C:
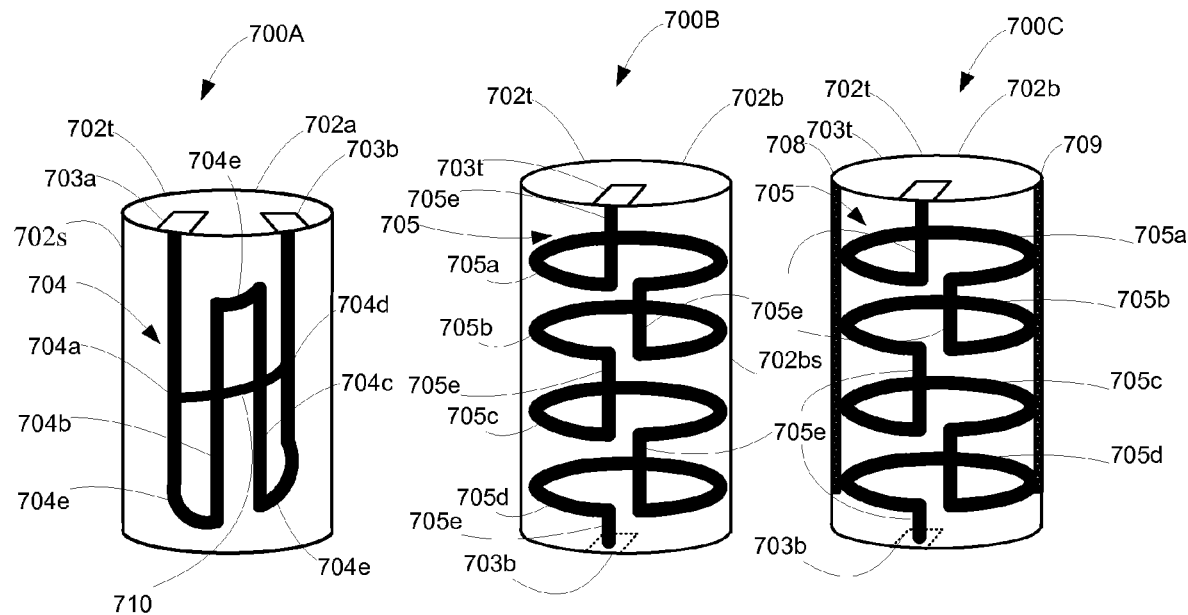
FIGS. 17A-17C illustrate alternate embodiments of a Z-directed delay line with transparent surfaces to display connections.

FIGS. 17A-17C and 18 illustrate embodiments of Z-directed signal delay line component. In general a Z-directed signal delay line comprises a body having a signal conductor routed therein with the signal conductor made from one of a dielectric material, and a magnetic material that slows down signals that travel through the delay line. The signal conductor has a length contained within the body and may be of the same length as the length of the body or may be longer in length than the length of the body. Connections to the signal conductor may be made via channels provided on the side surface of the Z-directed component or to conductive traces provided on the top and or bottom surfaces or by a combination of top and/or bottom traces and channels. In FIG. 17A, Z-directed component 700A has a body 702 having conductive traces 703a and 703b on its top surface 702t. Disposed within body 702a is delay line 704 comprised of a plurality of conductive legs comprising vertically oriented segments 704a-704d extending along a portion of the length of body 702a and connected by a plurality of short horizontal bars 704e in a serial fashion at their respective top and bottom ends (roughly approximating a W-shape) forming the delay line 704 in an undulating or a zigzag manner. The top ends of segments 704a and 704d (the start and end of the conductor forming the delay line) are shown connected to conductive traces 703a and 703b respectively on the top surface 702t of the body 702a. The additional length of the conductor forming delay line 704 inserted into a signal path causes the signal to travel a longer distance therefore delaying it. The connection to delay line 704 may also be accomplished using a channel provided in the side 702s of body 702a either in combination with conductive traces on the top or bottom surfaces or in lieu of top and bottom conductive traces. Additional segments may be added to delay line 704 to increase the amount of delay.

In FIG. 17B, a Z-directed component delay line 700B has a body 702 with conductive traces 703t and 703b on the top and bottom of body 702b. Within body 702b is delay line 705 comprised of a plurality of horizontally disposed (as viewed in FIG. 16B) C-shaped conductors 705a-705d spaced apart from one another and serially connected by a plurality of vertical leg segments 705e. The C-shaped conductors 705a-705d may also be described as being disposed approximately parallel to the top or bottom surfaces, 702t, 702b of the body 702 and the leg segments 705 as approximately parallel to the side surface of the body. The ends of leg segments 705e adjacent the top and bottom of body 702b connect to traces 703c and 703d on the top and bottom surfaces. Again the additional length of delay line 705 inserted into a signal path causes the signal to travel longer, delaying it. If there is excessive capacitive coupling between adjacent C-shaped conductors then a shielding material (not shown) may be disposed within body 702 between adjacent C shaped conductors and grounded. It is expected that this should remove most of the parasitic effects of this geometry. The connections between adjacent C-shaped conductors are made such that the magnetic flux of one C-shaped conductor cancels the next. This reduces the magnetic coupling between the C-shaped conductors. Additional C-shaped conductors may be added to increase the delay. Alternatively, the delay line may be arranged in a spiral configuration.

FIG. 17C illustrates a programmable version of the Z-directed delay line of FIG. 17B. Z-directed delay 700C has body 702b having top and bottom traces 703t. Delay line 705 disposed within body 702b is comprised of a plurality of serially connected C-shaped conductors as previously described. A shorting mechanism for the C-shaped conductors is disposed within or on the body 702b and may be comprised of at least one shorting bar. By selectably removing portions of the shorting bar between adjacent C-shaped conductor the amount of delay provided by Z-directed component delay line 700C may be adjusted or programmed. As illustrated two drillable shorting bars 708, 709 are shown and used to program the delay time of the part. In this embodiment shorting bars 708, 709 extend along the length of the body 702b and tangentially contact each of the C-shaped conductors. The shorting bars 708 and 709 are diametrically opposed to one another such that a line drawn between them would bisect each C-shaped conductor 705a-705d. If the minimum delay is desired then shorting bars 708, 709 are left in place.

If the maximum delay is desired then shorting bars 708, 709 are removed by drilling or etching the conductive material away. As portions of shorting bars 708, 709 are removed between adjacent C-shaped conductors, the time delay will increase by ½ or whole turn increments at time. This can be used in development to easily determine the best signal delay for production purposes. Also each PCB may be tuned during functional testing to optimize the delay of signals to compensate for variation of other parameters in a design.

One or more shorting bars may also be used with Z-directed delay line 700A by placing the shorting bar horizontally across the vertical conductor segments 704a-704d as indicated by the line 710. However with this design the time delay would have to be adjusted prior to insertion of the part into a PCB. In yet another embodiment, one or more channels may be provided as a shorting mechanism in lieu of shorting bars and by use of selective plating techniques in plating such Z-directed delay lines portions of delay lines 704 or 705 may be shorted together.

Figure 18:
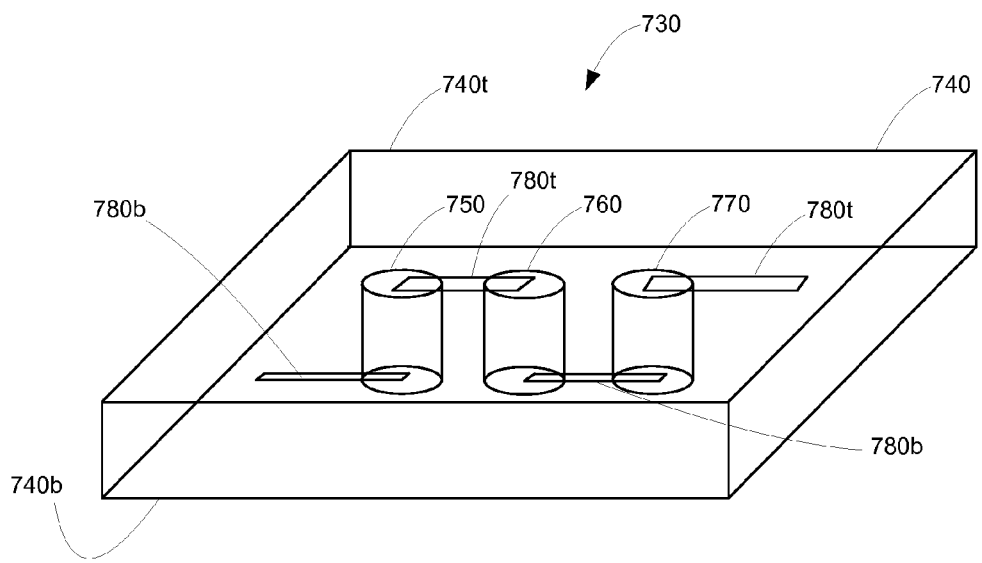
FIG. 18 illustrates a programmable Z-directed delay line circuit having multiple Z-directed delay lines with transparent surfaces to display connections.

In FIG. 18 a variable delay line 730 may be created by connecting any number of Z-directed delay lines together by conductive tracers on a PCB. These surfaces are shown as transparent to illustrate the connections. Inserted in PCB 740 are cylinders 750, 760, and 770 which can represent either a Z-directed delay line, as illustrated in FIGS. 17A-17C, or a conductive plug or Z-directed signal pass through component and which are connected in series fashion by top and bottom conductive traces 780t, 780b as shown on the top and bottom surfaces 740t, 740b of PCB 740. Cylinders 750, 760 and 770 may also be connected serially via conductive traces provided on internal layers of PCB 740 if present or by a combination of internal or external conductive traces. If cylinders 750, 760 and 770 each represent a Z-directed delay line element, then total delay across delay line 730 may be changed by replacing a Z-directed component delay line elements with a Z-directed component signal pass through device, previously described, that introduces no significant delay or with another Z-directed component delay line having a greater delay. One advantage of this configuration is that no changes are required to the PCB layout design while still allowing the total signal delay to be adjusted.

Z-Directed T-Filter/PI Filter

A Z-directed T filter and a Z-directed Pi filter are three port devices having an input conductor, output conductor and a ground conductor. T filters are generally comprised of, for a low pass filter, two serial resistors connected between an input and an output with a capacitor connected between the resistors and to ground or, for a high pass filter, two serial capacitors connected between the input and an output and a resistor connected between the capacitors and to ground. Schematically these filters resemble the letter T. Pi filters have one component connected between input and output with a second component connected between input and ground and a third component connected between the output and ground. The first component may be a resistor and the second and third component may be capacitors and vice versa. Inductors may also be used. These devices may be mounted in a Z-directed component in a similar fashion as the transistor shown FIGS. 8 and 9.

Z-Directed Ferrite Bead

FIGS. 19A-19C illustrate cross-sectional views of alternate embodiments of Z-directed ferrite beads. The construction of these devices is similar to that shown and described in FIGS. 5B-5H. Disposed, as shown in FIG. 19A, in a portion of the body 1000 is a cylinder 1001 of magnetic material having an opening through which conductor 1002 passes. The conductor 1002 extends to the top and bottom surfaces of the body 1000 where it is electrically connected to top and bottom traces. The conductor may also be connected as previously described such as to a channel on the side surface of the body or two side channels etc. By varying the outside diameter cylinder 1001 the magnetic properties are varied controlling the characteristics of the ferrite bead. As shown cylinder 1001 is contained within body 1000 but its outer circumference may also extend to the side surface of body 1000. This construction creates a single conductor differential Z-directed ferrite bead.

In FIG. 19B two conductors 1002-1 and 1002-2 pass through two openings provided in cylinder 1001 in the body 1000 forming a two conductor differential mode Z-directed ferrite bead. The two parallel spaced apart conductors 1002-1 and 1002-2 are enclosed by cylinder 1001 comprised of magnetic material. By varying the outside diameter cylinder 1001 the magnetic properties are varied controlling the characteristics of the ferrite bead. As shown cylinder 1001 is contained within body 1000 but its outer circumference may also extend to the side surface of body 1000.

Shown in FIG. 19C, is a two conductor common mode Z-directed ferrite bead that is substantially similar to a two conductor differential mode Z-directed ferrite bead but with both of the conductors 1002-1, 1002-2 within the cylinder 1001a passing through a common opening 1003 in the magnetic material forming cylinder 1001a. The volume within opening 1003 is not filled with magnetic material. The volume may be left empty, i.e. air filled, or another nonmagnetic material may be used to filled the portion not filled by conductors 1002-1, 1002-2.

Z-Directed Switch

The Z-directed component acting a single pole single position, or a multi-pole multi position switch may be used to program different settings into a PCB by rotating it to different positions about its axis of insertion. FIGS. 20A and 20B illustrate a PCB 1101 having a multiplicity of internal layers 1102 having one or more conductive traces and a multiplicity of conductive surface traces 1103, three of which are further designated as a, b and c, on outer surface 1104. Conductive traces may be provided on both outer surfaces of PCB 1101. In FIG. 20A, Z-directed component 1105 is mounted in mounting hole 1106 shown as a through hole. A channel 1107 of Z-directed component 1105 is shown aligned with circuit trace 1103a. The channel 1107 extends along the side surface 1105 from the top surface 1105t to bottom surface 1105b. However the length of the channel may be less than the length of the body of the Z-directed component and may extend only from one of the top and bottom surfaces toward the other or may be disposed intermediate the top and bottom surfaces such as, for example, extending only between the two internal layers of PCB. Shown inserted into channel 1107 is a compressive conductive member, such as rod 1109. Provided in top surface 1105t of Z-directed component 1105 is turning structure, such as slot 1108 used to rotate Z-directed component 1105 into alignment with the desired surface trace 1103. Other configurations such as a pair of holes or cross-shaped slots may also be used in lieu of slot 1108.

Referring now to FIG. 20B which is a sectional view taken along line 20B-20B of FIG. 20A with Z-directed component 1105 removed, a multiplicity of internal connection points 1110-1113 are shown. With compressive conductive member 1109 of Z-directed component 1105 aligned with trace 1103a, connection between trace 1103a and connection point 1110 is made as indicated by the dashed line interconnecting these two points. If compressive conductive member 1109 of Z-directed component 1105 is aligned with trace 1103b, then trace 1103b will be connected to connection point 1111 as indicated by the dashed line interconnecting these two points. Similarly if compressive conductive member 1109 of Z-directed component 1105 is aligned with trace 1103c, then trace 1103c will be connected to connection points 1112 and 1113 as indicated by the dashed line shown interconnecting these three points.

When the compressive conductive member is a rod it may have a diameter that is less than and preferably equal to or greater than the diameter of channel 1107. In FIGS. 20C and 20D, compressive conductive rod 1109 is shown having a diameter that is larger than the diameter of channel 1107. This is done to ensure that compressive rod 1109 will be compressed when inserted in channel 1107 helping to ensure that compressive conductive rod 1109 will be retained within the body of Z-directed component 1105 due to the interference fit between the rod and channel. Further, as illustrated in FIG. 20D, channel 1107 is positioned at the edge of Z-directed component 1105 so that the center line 1109a of compressive conductive rod 1109 will be positioned at a distance that is within or less than the radius R of Z-directed component 1105 while still allowing a strip 1109s of the outer side surface of compressive conductive rod 1109 to extend beyond the side surface 1105s of Z-directed component 1105 to make the desired electrical connections. This strip or portion 1109s of the outer periphery is exaggeratedly shown in FIG. 20D. It is expected that this will also aid in keeping Z-directed component 1105 inserted into PCB 1101. Additional channels and compressive conductive rods may also be provided in Z-directed component 1105 and arranged about the periphery of Z-directed component 1105 as needed to meet the design requirements for the circuit forming a multi-pole switch.

It will be realized that if the diameter of compressive conductive rod 1109 is equal to or less than the diameter of the channel 1107 and the centerline of the compressive conductive rod is at or beyond the side surface of the body of Z-directed component 1105, the rod will tend to fall out of the channel. Some means such as an adhesive on the portion of the compressive conduct rod within the channel or on the surface of the channel will need to be used to retain the rod 1109 in channel 1107 when inserted therein prior to the insertion of Z-directed component 1105 into PCB 1104. With compressive rod 1109 having a diameter that is less than the diameter of channel 1107 shims or other means such as raised portions in the channel wall inserted between the channel surface and the compressive conductive rod may be used to ensure the compressive conductive rod will have a portion extending beyond the side surface 1105s of Z-directed component 1105.

In general, the channel shape and the compressive conductive member shape should correspond to one another so that the rod will be held by the channel when it is inserted therein while still allowing a portion of the compressive member to extend beyond the side wall of the Z-directed component. While cylindrical channels and rods are described it is understood that other shapes may also be used. For example, as shown in FIG. 20D, channel 1120 is generally triangular or trapezoidal in section with the open apex aligned with the side surface. Shown inserted in channel 1120 is a generally rectangular compressive conductive member 1122 which has pinched-in waist 1122w caused by the sectional shape of channel 1120. Member 1122 may also have a triangular section as well.

Use of Z-directed component 1105 in this manner allows PCB 1101 to be configured with an identification indicia such as a serial number using a minimal number of components. Connections between the surface layers of PCB 1101 (either top surface, bottom surface or both) can also be made to inner layers by the use of a well provided in Z-directed component 1105 as previously described. Further one or more wells and one or more center conductors may be used to provide for a multiplicity of connections between and among the internal layers 1102 and surface layers of PCB 1101. Although it is contemplated that once Z-directed component 1105 is positioned and aligned with the desired traces it would be plated in place, Z-directed component 1105 may also be removably inserted into mounting hole 1106 allowing for it to be realigned similar to a single-gang or multi-gang rotary switch, depending on the number of layers in PCB 1101. A slot may be provided in one of the end surfaces of Z-directed component to allow it to be rotated by a screwdriver or other similar means. To hold Z-directed component in the mounting hole while still allowing for rotation, compliant strips or other similar means may be provided on the circumferential surface of the Z-directed component When the mounting hole is a through hole, the top surface 1105t may have radial projections 1130 or a flange that can be used to prevent the Z-directed component from sliding out of the mounting hole when being rotated.

Building upon a Z-directed switch, the Z-directed component 1105 may have a number of different circuits or values of components, indicated by dashed block 1115 in FIG. 20C, incorporated into the body thereof and be used to connect one or more traces on a layer of the PCB (interior or exterior layer) with another one or more traces on the same or other surfaces in the PCB using channels or conductors as previously described. By having multiple paths through a Z-directed component different circuits can be selected by rotating the part to select which conductor(s) is/are bridged that have the desired circuit component between 2 or more connection points. For example one Z-directed component may have a range of resistive values therein that are selected by inserting the 2-directed component and aligning it with the desired conductive traces. The concept may be expanded to any combination of electronic components that will fit within the volume of the body of the Z-directed component along with the necessary conductive traces.

Z-Directed Internal Connector

Figures 21A, 21B:
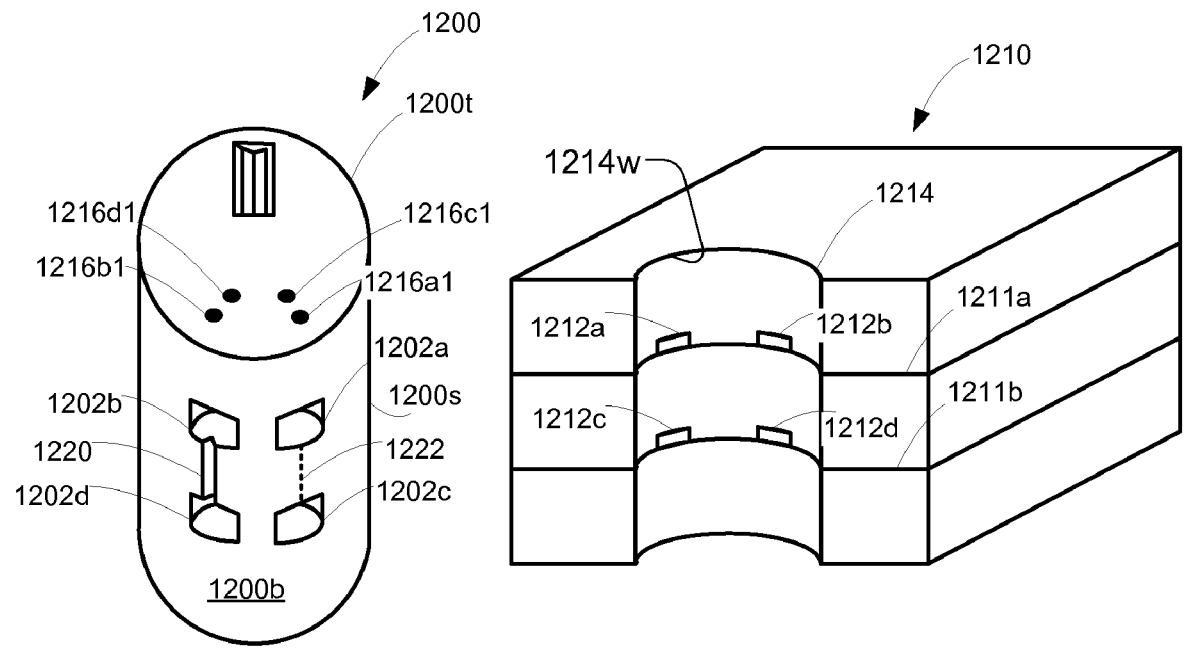
FIGS. 21A-21D illustrate a Z-directed component utilized for making internal connections between traces on different internal layers or between traces on a given internal layer of a PCB along with an additional feature of a testing path for checking the connections.
Figures 21C, 21D:
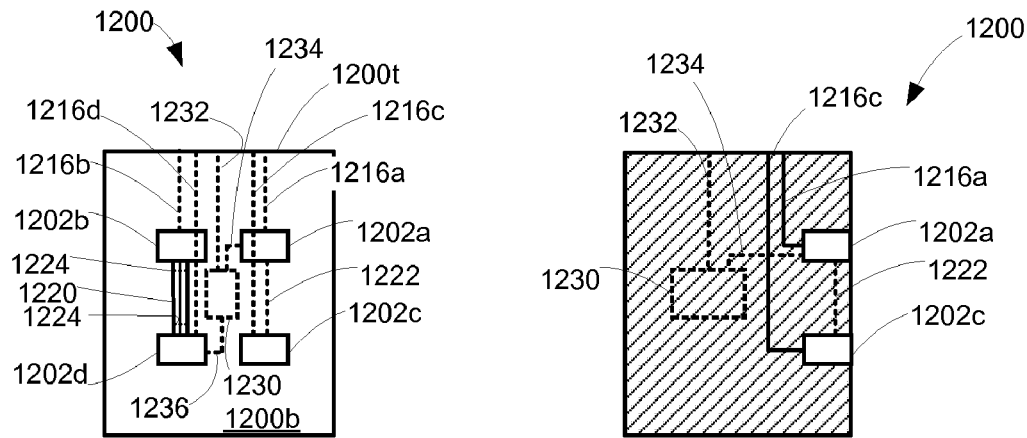

One of the problems with very high speed signals is that transitioning between PCB layers requires a via hole to make the transition. The via copper has a significant surface area as compared to the signal. This causes a transmission line discontinuity that may affect the signal quality. Current high speed PCB designs sometimes require these vias to be back drilled to reduce the surface area of the via. An example would be when a signal transitions between two inner layers then the outer segments of the via may need to be removed. A drill bit is used to remove the copper between the surfaces of the PCB down to the area that the signal is located in the PCB. FIGS. 21A, 21C, and 21D illustrate another configuration of an internal Z-directed component connector that can make the internal connections without the need for this back drilling process. This embodiment also illustrates the use of test paths with the body of the Z-directed component. This interior connector may be used anytime a plating well is not desired to the top or bottom layers of a PCB.

In this embodiment a Z-directed component 1200 has at least two recessed areas or pockets 1202a, 1202b, 1202c, 1202d on the side surface 1200s that will contain a solder paste material (not shown) that will either expand or reflow when heated to make the desired connections. A conductor 1216a, 1216b, 1216c, 1216d is provided between top surface 1200t and each of pockets 1202a-1210d, respectively. The portions 1216a1-1216d1 of conductors 1216a-1216d on surface 1200t may be used as test points by test probes as described herein.

Shown in the FIG. 21B is a sectional view of a four-layer PCB 1210 having two internal layers 1211a, 1211b, each having two conductive signal traces 1212a and 1212b, 1212c and 1212d, respectively, provided at four internal locations in the wall 1214w of mounting hole 1214. For purposes of illustration only, it is desired to interconnect trace 1212a to trace 1212c and trace 1212b to trace 1212d. Other numbers of internal layers and signal traces may also be connected in a similar fashion using an appropriately designed Z-directed component internal connector. In Z-directed component 1200 four correspondingly positioned pockets 1202a-1202d are positioned on side surface 1200s so that when Z-directed component 1200 is inserted into mounting hole 1214 these pockets will be adjacent to traces 1212a-1212d respectively on internal layers 1211a, 1211b.

The pockets may be interconnected by a variety of means as is known in the art. Two examples are illustrated in FIGS. 21A and 21C. One is a channel 1220 cut into side surface 1200s interconnecting pockets 1202b and 1202d that may be filled with solder paste or into which the solder paste in the pockets will flow when heating of the PCB occurs. Additional channels interconnecting all of the pockets together can be provided and the pockets may be selectably interconnected by use of removable dams indicated by dashed lines 1224 provided in the channel 1220. This permits the interconnections to be determined after the Z-directed connector has been fabricated. Where a connection is desired between two pockets the dam 1224 in the channel interconnecting these pockets would be removed. The other connection may be done by a conductor 1222 provided in the body 1200b interconnecting pockets 1202a and 1202c. With this arrangement the manner of the interconnection would need to be predetermined so that the conductors are positioned between the desired interconnection points.

Once the Z-directed component 1200 is soldered in place the internal connections can be checked by test probes placed on test points 1216a1-1216d1. For the illustrated pairs of connections only a single test point is needed for each pair of interconnected pockets; however it may be desired to have a test point for each connection pocket as shown.

FIGS. 21C and 21D show Z-directed component internal connect 1200 having an optional multi-terminal component 1230 either embedded or formed within the body 1200b. Component 1230 may be an active or passive component may also be inserted in the connection path to the internal layers 1211a, 1211b of PCB 1210. As shown one terminal of component 1230 is connected to top surface 1200t of Z-directed component 1200 via conductor 1232, a second terminal is shown connected to pocket 1202a via conductor 1234 and a third terminal of component 1230 is shown connected to pocket 1202d via conductor 1236. Components having more or less terminals may also be accommodated within Z-directed component 1200 depending on volume available for the internal component and conductors.

The test paths 1216a-1216d may not be present in some designs. However, the testing paths may be used with any of the Z-directed parts described herein to improve testability. Also the top and or bottom surface of this Z-directed component may have a conductive coating substantially coextensive with the surface to provide further shielding when the Z-directed component is installed and plated in a PCB.

Figure 22A:
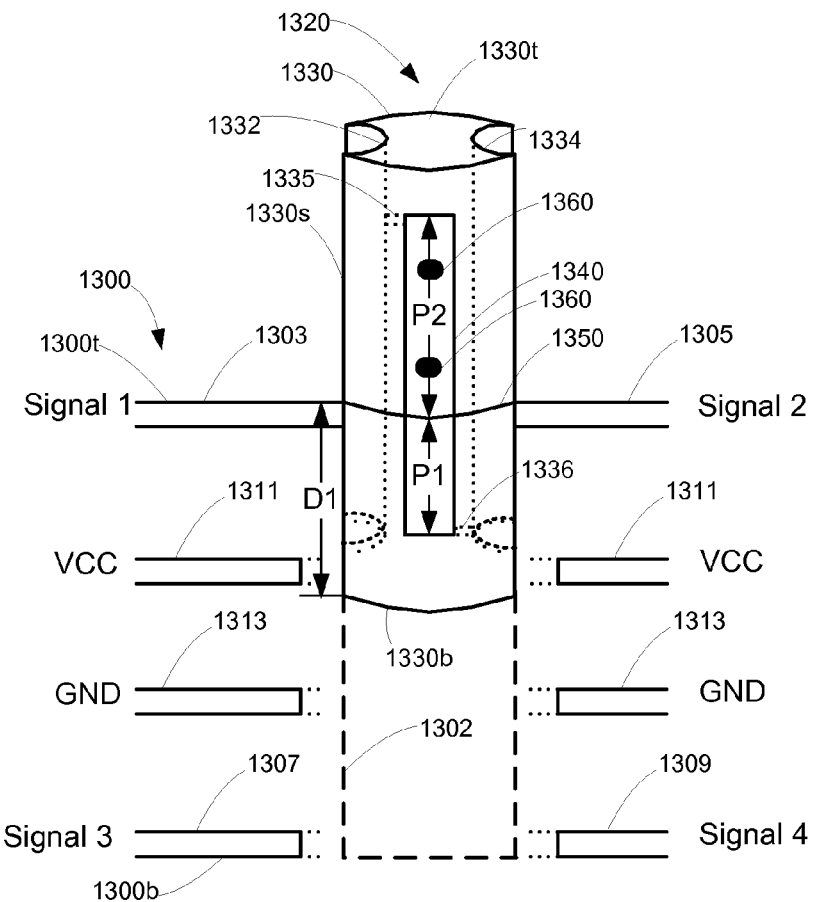
FIGS. 22A and 22B illustrate the use of a plateable side strip and partial insertion of Z-directed components to alter value or function of the Z-directed component.
Figure 22B:
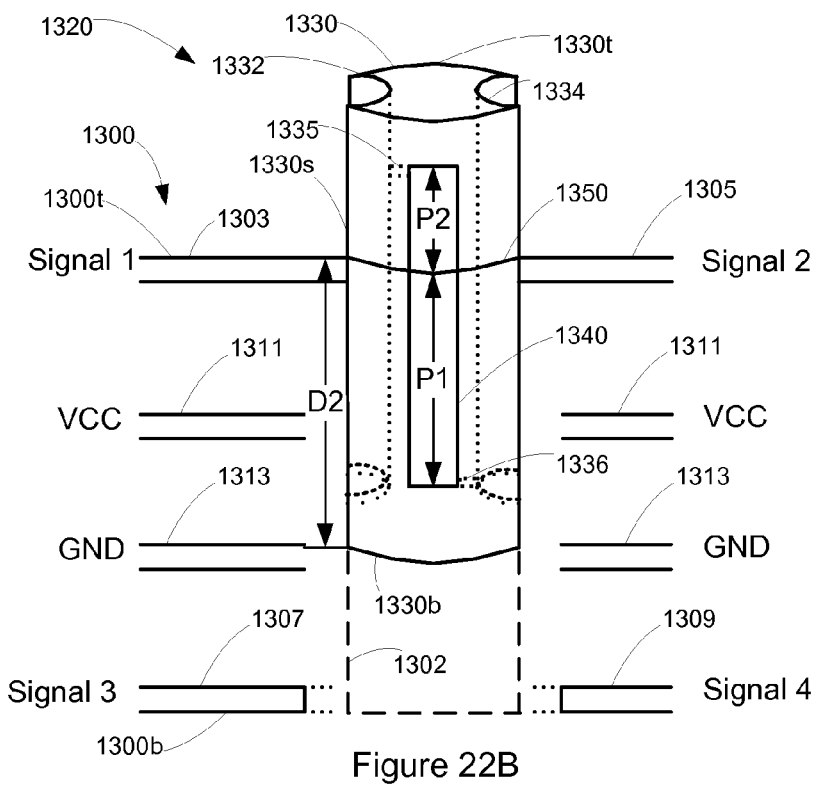

In some cases depending on the desired function, a Z-directed component may work best when partially inserted into the PCB. A Z-directed component may have a parameter, such as resistivity that can be controlled by the depth that it is inserted into the PCB. One example would be a resistor that normally has a fixed resistive value between the top and bottom surfaces by applying a uniform resistive film over the side surface of the body. This is illustrated in FIGS. 22A and 22B illustrating a PCB 1300 having a Z-directed resistor 1320 inserted at two different depths into a mounting hole 1302 indicated by the dashed lines. The PCB 1300 is illustrated as having signal traces 1303, 1305 on one external surface, top surface 1300t and signal traces 1307, 1309 on the other external surface, bottom surface 1300b. As shown in both figures Z-directed resistor 1320 interconnects signal trace 1303 to signal trace 1305. Two internal layers are shown for PCB 1300, a first voltage reference layer Vcc 1311, and a second voltage reference layer GND 1313. Side surface 1330s of body 1330 has two closed end or blind channels, 1332, 1334 extending from top surface 1330t. These blind channels could also both extend from the bottom surface 1330b. A plateable strip 1340 is shown disposed on side surface 1330s of body 1330 between the top and bottom surfaces 1330t, 1330b. Disposed within body 1330 are conductors 1335, 1336 electrically connected to respective ends of plateable strip 1340. The other ends of conductors 1335, 1336 are electrically connected to channels 1332, 1334. Line 1350 indicates the position of top surface 1300t with respect to body 1330. Z-directed resistor 1320 is inserted into mounting hole 1302 a depth D1 where portion P1 represents the portion of plateable strip 1340 below the top surface 1300t of PCB 1300 and portion P2 represents the portion of plateable strip 1340 above. When the circuit board 1300 is plated the exposed side surface 1300s above the top surface 1300t along with portion P2 of plateable strip 1340 would be plated with copper shorting out the portion P2 and reducing the overall resistance of Z-directed resistor 1320. The channels 1332, 1334 are closed ended to prevent the plating material from shorting the two channels together. In FIG. 22B, Z-directed resistor is shown inserted at a greater depth D2. Accordingly on plateable strip 1340 portion P1 has increased and portion P2 has decreased. At insertion depth D2 and after plating has occurred, the overall resistive value of Z-directed resistor 1320 is greater than that when inserted at depth D1.

This concept may be used with any passive element that can have its value adjusted by plating over part of a surface. One example is a Z-directed inductor wherein portions of the windings are exposed along the length of the side surface. Another example is a Z-directed capacitor having stacked disks similar to those as shown in FIG. 15 but modified so as not to have the annular plate 617 connected to either of the side channels 604, 608. Instead one or more of the annular plates 617 would be electrically connected to a corresponding conductor disposed within the body 605 with the other end of the conductor being exposed on the side surface of the body 605. A further example is a signal delay line such as that shown in FIG. 17B having a portion of C-shaped conductors 705a-705d exposed in the side surface 702bs. Another use for this partial insertion technique would be where different electronic functions exist in regions between the top and bottom surfaces of the body of the Z-directed component. As shown in FIG. 7B multiple devices or circuits may be provided in the body 150. Internal connections may be provided to plateable pads provided in the side surface. The exposed pads would be shorted out by the copper plating in a similar way to the resistor example. As discussed later, a Z-directed component can be adjusted after the PCB has been manufactured. A circuit design may call for a Z-directed component providing an optional function or feature to the circuit to be partially inserted into the PCB and make no connections at the time of manufacturing. Later if the Z-directed component is needed to add its new function to the circuit in the PCB it would be pushed into place while in the field.

In another embodiment the strip used in a Z-directed variable value component may also have one or more etchable portions 1360 having a conductor connected to each end of the strip (see FIG. 22A). The conductors may be internal to the body of the component, provided on an external surface or be a combination of external and internal connects as previously shown and described. The value of the Z-directed variable value component would be adjusted by selectively etching away etchable portions 1360 of the strip while still maintaining a signal path between the two end conductors. For example, if the strip were comprised of a resistive material, removal of some of this material by etching would decrease the value of the resistance. Depending on the material within the etchable portions the value of the component may increase or decrease as the material is etched away. Depending on the depth to which such a component is mounted in the PCB, fewer or more of the etchable portions would be exposed to etching.

Installation of Z-Directed Components in a PCB

Figure 23:
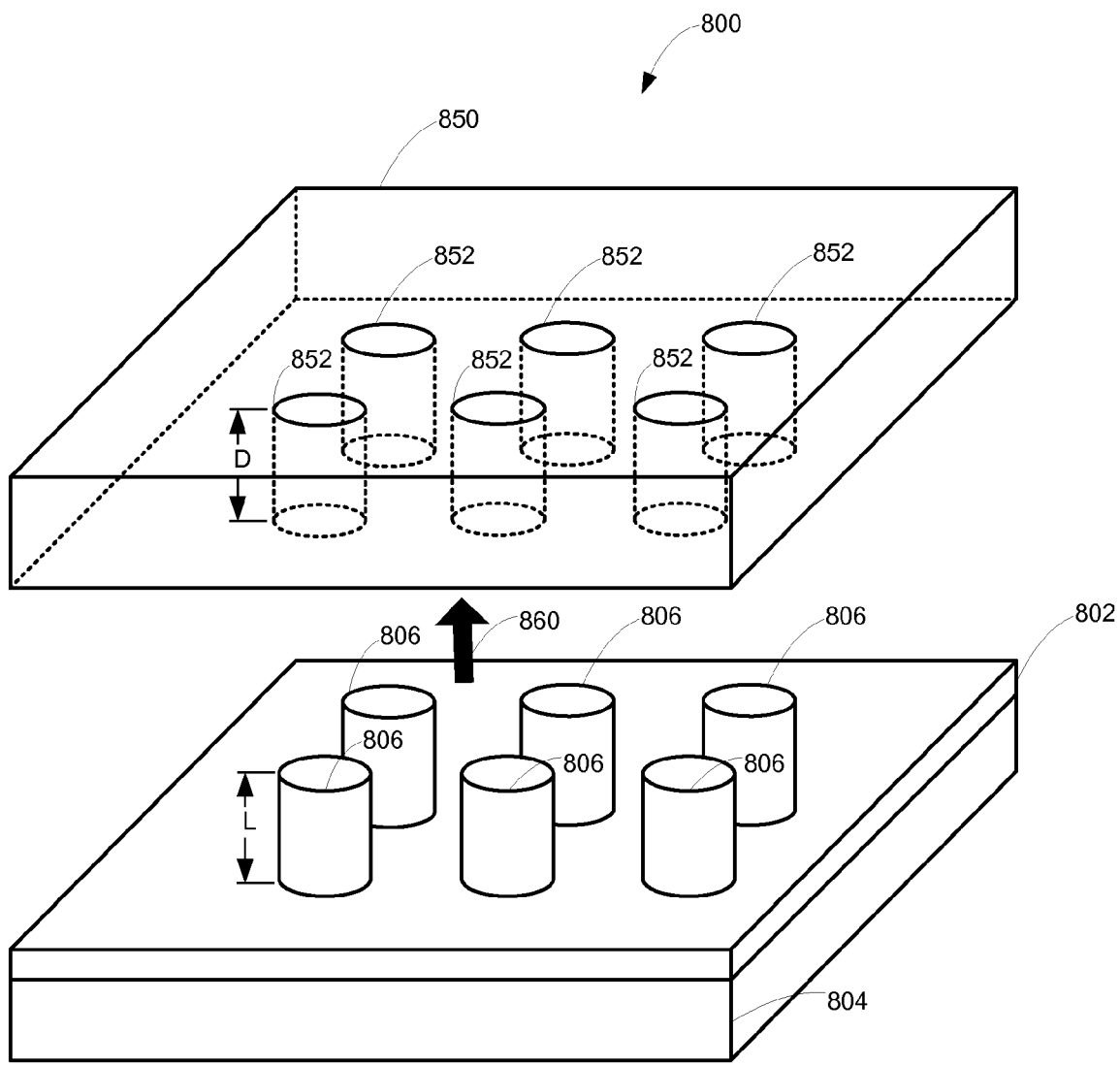
FIG. 23 is an illustration of a system for inserting Z-directed components into a PCB.

Given the shape and intended placement of a Z-directed component to be within a recess or through-hole in a PCB one way of achieving this placement is by use of an insertion system 800 comprising an orienting fixture 802 and ram plate 804 as shown in FIG. 23. Positioned on orienting fixture 802 are one or more Z-directed components 806. Orienting fixture 802 using locating surfaces or other indicia provided on Z-directed components 806 ram plate orients these components for insertion into PCB 850 shown positioned over orienting fixture 802 and having one or more mounting holes 852 for receiving Z-directed component 806 therein as previously described. PCB 850 is held by a fixture not shown. As shown mounting holes 852 are through-holes and the depth D of the holes corresponds to the length L of Z-directed components 806. As previously described the length L may be less than, equal to or greater than depth D allowing for recessed mounting, flush mounting or extended mounting. For recessed Z-directed components, resist material will be needed to ensure that only those portions of the recessed surface that are to be plated will be plated and to avoid plating of the entire recessed surface.

Ram plate 804 is raised as indicated by arrow 860 inserting Z-directed components 806 into corresponding mounting holes 852 in PCB 850 through the bottom surface of PCB 850. The ram plate may have cylinders that press each component 806 through the orienting fixture 802 into mounting holes 852 to the correct depth. These cylinders may be individually operated or any combination at one time.

To facilitate use of a Z-directed component, insertion equipment that orientates the part and inserts them into the PCB will be needed. Although not shown it should be realized that pick and place equipment may also be used to insert a Z-directed component into a PCB. Such pick and place equipment may insert a Z-directed component from either the top or bottom surface of a PCB. A plunger device will be needed to press the Z-directed component into the PCB to the desired insertion depth.

Figure 24:
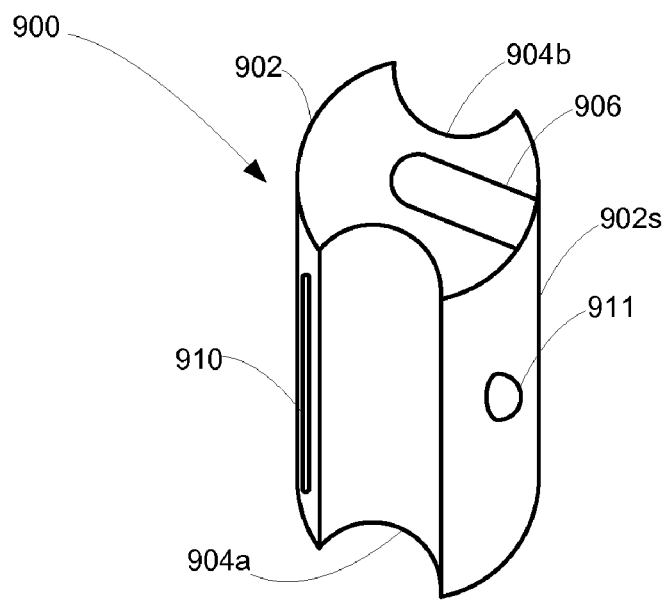
FIG. 24 is an illustration of a Z-directed component having a glue strip and a glue dot for mounting of the Z-directed component in a PCB.
Figure 25:
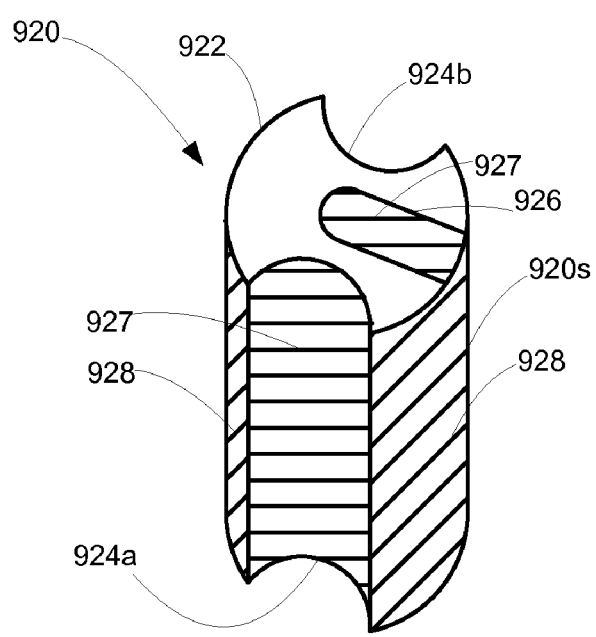
FIG. 25 is an illustration of a Z-directed component showing copper seed material and resist material used when plating a Z-directed component.

Z-directed components may be press fit or glued in place in a PCB. The PCB and Z-directed component interface can include resist material to prohibit plating or seed material to help facilitate plating. Examples are shown in FIGS. 24 and 25. In FIG. 24 a Z-directed component 900 having a body 902 and two channels 904a and 904b extending along side surface 902s and a conductive top trace 906 is shown having a glue strip 910 or a glue dot 911 on side surface 902s allowing Z-directed component 900 to adhere to the wall of a mounting hole in a PCB prior to plating. In FIG. 25 a Z-directed component 920 having a body 922 and two channels 924a and 924b extending along side surface 920s and a conductive top trace 926 is shown having copper seed material 927 indicated by the horizontal lines on channels 924a, 924b conductive trace 926 with resist material 928 indicated by the angled lines on the remaining portions of side surface 902s. Compliant materials may be used to keep plating material from migrating past desired locations. For parts that extend past the surface of the PCB, the seed copper may be taken around the edge of a Z-directed component down the side surface to the surface of the PCB.

Other surface mount parts may be mounted over the part and may even have pads or balls to have surface mount parts connected directly to them. For example, for ball gate array devices, the balls may be attached directly to the top surface of a Z-directed component. Z-directed components may also be contained in a tape and reel packaging material. A part can be extracted using a pick and place vacuum head and be partially inserted in to a PCB. A camera can then be used to check the orientation of the Z-directed component and the Z-directed component position adjusted before being fully inserted into the PCB.

The foregoing description of several embodiments of the invention has been presented for purposes of illustration. It is not intended to be exhaustive or to limit the invention to the precise forms disclosed, and obviously many modifications and variations are possible in light of the above teaching. It is intended that the scope of the invention be defined by the claims appended hereto.

What is claimed:

1. A Z-directed multi-terminal component for mounting in a printed circuit board (PCB) having a mounting hole having a depth D therein, comprising:
    an insulative body having a top surface, a bottom surface and a side surface, a cross-sectional shape that is insertable into the mounting hole in the PCB and a length L;
    at least one conductor extending through at least a portion of the length L of the body with the conductor in electrical connection with one of the top and bottom surfaces of the body;
    one of the top and bottom surfaces further comprising a conductive trace electrically connected to an end of the conductor adjacent thereto and extending therefrom to an edge of the body;
    the side surface of the body further comprising at least two channels therein, each of the at least two channels extending from at least one of the top surface and bottom surface toward the opposite surface; and
    a three-terminal filter disposed within the body interconnecting the conductor, and each of the at least two channels.

2. The Z-directed component of claim 1 wherein each of the at least two channels extends between the top and bottom surfaces.

3. The Z-directed component of claim 1 wherein the three terminal filters is one of a T-filter and a Pi filter.

4. A Z-directed multi-terminal component for mounting in a printed circuit board (PCB) having a mounting hole having a depth D therein, comprising:
    an insulative body having a top surface, a bottom surface and a side surface, a cross-sectional shape that is insertable into the mounting hole in the PCB and a length L;
    at least two conductors extending through at least a portion of the length L of the body with one of the at least two conductors in electrical connection with one of the top and bottom surfaces of the body and the other of the at least two conductors in connection with the other one of the top and bottom surfaces of the body;

each of the top and bottom surfaces further comprising a conductive trace electrically connected to an end of the conductor adjacent thereto and extending therefrom to an edge of the body;

the side surface further comprising at least one channel therein, the at least one channel extending from at least one of the top surface and bottom surface toward the opposite surface; and a multi-terminal filter disposed within the body interconnecting each the conductors, and the at least one channel.

5. The Z-directed component of claim 1 wherein the at least one channel extends between the top and bottom surfaces.

6. The Z-directed component of claim 1 wherein the multi-terminal filter is one of a T-filter and a Pi filter.

7. A Z-directed multi-terminal component for mounting in a printed circuit board (PCB) having a mounting hole having a depth D therein, comprising:

an insulative body having a top surface, a bottom surface and a side surface, a cross-sectional shape that is insertable into the mounting hole in the PCB and a length L;

a multi-terminal filter disposed within the body;

a plurality of conductors disposed within the body corresponding to the number of terminals in the multi-terminal filter with one of the plurality of conductors extending from each of the terminals in the multi-terminal filter to one of the top surface of the body and the bottom surface of the body; and each of the top and bottom surfaces further comprising a plurality of conductive traces with one conductive trace electrically connected to an end of each of the plurality of conductors adjacent thereto and extending therefrom to an edge of the body.

8. The Z-directed component of claim 7 wherein the multi-terminal filter is one of a T-filter and a Pi filter.

* * * * *

UNITED STATES PATENT AND TRADEMARK OFFICE
CERTIFICATE OF CORRECTION

| | | Page 1 of 1 |
|---|---|---|
| PATENT NO. | : 8,237,061 B2 | |
| APPLICATION NO. | : 12/508199 | |
| DATED | : August 7, 2012 | |
| INVENTOR(S) | : Keith Bryan Hardin et al. | |

It is certified that error appears in the above-identified patent and that said Letters Patent is hereby corrected as shown below:

Claims

Column 25, line 15, claim 5, replace "1" with -- 4 --.

Column 25, line 17, claim 6, replace "1" with -- 4 --.

Signed and Sealed this

Twenty-second Day of December, 2015

Michelle K. Lee
*Director of the United States Patent and Trademark Office*